US010950786B2

(12) United States Patent
Lung et al.

(10) Patent No.: US 10,950,786 B2
(45) Date of Patent: Mar. 16, 2021

(54) LAYER COST SCALABLE 3D PHASE CHANGE CROSS-POINT MEMORY

(71) Applicant: MACRONIX INTERNATIONAL CO., LTD., Hsinchu (TW)

(72) Inventors: Hsiang-Lan Lung, Ardsley, NY (US); Erh-Kun Lai, Tarrytown, NY (US); Chiao-Wen Yeh, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/259,746

(22) Filed: Jan. 28, 2019

(65) Prior Publication Data
US 2019/0355903 A1    Nov. 21, 2019

Related U.S. Application Data

(60) Provisional application No. 62/672,595, filed on May 17, 2018.

(51) Int. Cl.
*H01L 45/00* (2006.01)
*G11C 13/00* (2006.01)

(52) U.S. Cl.
CPC .......... *H01L 45/1233* (2013.01); *H01L 45/06* (2013.01); *H01L 45/1616* (2013.01);
(Continued)

(58) Field of Classification Search
CPC . H01L 45/06; H01L 45/1616; H01L 45/1625; H01L 45/1675
See application file for complete search history.

(56) References Cited

U.S. PATENT DOCUMENTS 6,579,760 B1 *   6/2003   Lung ...................... G11C 11/56
                                                          257/E27.004
8,284,601 B2    10/2012   Son et al.
(Continued)

FOREIGN PATENT DOCUMENTS

CN    103515386 A    1/2014
CN    107104121 A    8/2017
(Continued)

OTHER PUBLICATIONS

TW Office Action from Application No. 10821065970 dated Nov. 11, 2019, 10 pages (with English Translation).
(Continued)

*Primary Examiner* — Dale E Page
*Assistant Examiner* — Quovaunda Jefferson
(74) *Attorney, Agent, or Firm* — Haynes Beffel & Wolfeld LLP

(57) ABSTRACT

A 3D memory includes a plurality of first access line levels, a plurality of second access line levels and a plurality of memory cell levels, the memory cell levels being disposed between corresponding first access line levels and second access line levels. The first access line levels include a plurality of first access lines extending in a first direction, and a plurality of remnants of a first sacrificial material disposed between the first access lines. The second access line levels include a plurality of second access lines extending in a second direction and a plurality of remnants of a second sacrificial material disposed between the second access lines. The memory cell levels include an array of memory pillars disposed in the cross-points between the first access lines and the second access lines in adjacent first and second access line levels.

18 Claims, 18 Drawing Sheets

(52) U.S. Cl.
CPC ...... *H01L 45/1625* (2013.01); *H01L 45/1675* (2013.01); *G11C 13/0004* (2013.01); *H01L 45/144* (2013.01)

(56) References Cited

U.S. PATENT DOCUMENTS

| | | | |
|---|---|---|---|
| 8,822,966 B2* | 9/2014 | Takahashi | H01L 27/2481 257/1 |
| 9,070,872 B2 | 6/2015 | Huo et al. | |
| 9,230,973 B2 | 1/2016 | Pachamuthu et al. | |
| 9,589,979 B2 | 3/2017 | Hong | |
| 10,411,119 B2 | 9/2019 | Lee et al. | |
| 2009/0023242 A1* | 1/2009 | Lung | H01L 45/06 438/102 |
| 2011/0049465 A1* | 3/2011 | Nagashima | H01L 27/24 257/5 |
| 2012/0241705 A1* | 9/2012 | Bresolin | H01L 45/06 257/2 |
| 2016/0079258 A1 | 3/2016 | Lee | |
| 2016/0133671 A1* | 5/2016 | Fantini | H01L 21/7682 257/4 |
| 2018/0122858 A1 | 5/2018 | Frost et al. | |

FOREIGN PATENT DOCUMENTS

| | | |
|---|---|---|
| JP | 201557868 A | 3/2015 |
| TW | 201133795 A | 10/2011 |
| TW | 201715701 A | 5/2017 |

OTHER PUBLICATIONS

Kau, et al., "A stackable cross point phase change memory," 2009 International Electron Devices Meeting, Baltimore MD, Dec. 7-9, 2009, pp. 27.1.1-27.1.4.

Li et al., "Evaluation of SiO2 Antifuse in a 3D-OTP Memory," IEEE Transaction on Device and Materials Reliability, vol. 4, No. 3, Sep. 2004, 6 pages.

Ovshinsky, "New Transformative Possibilities for Ovonic Devices," E*PCOS2010, European Symposium on Phase Change and Ovonic Science, Milan, Italy Sep. 6-7, 2010, 9 pages.

Sasago, et al., "Cross-point phase change memory with 4F2 cell size driven by low-contact-resistivity poly-Si diode," 2009 Symp. on VLSI Technology, Jun. 16-18, 2009, 2 pages.

* cited by examiner

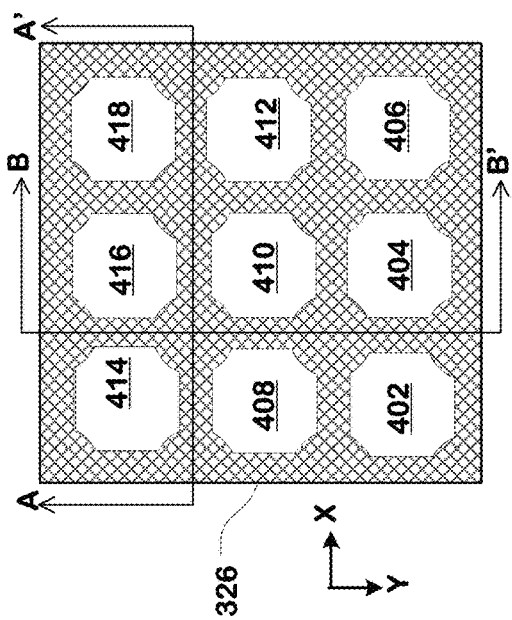
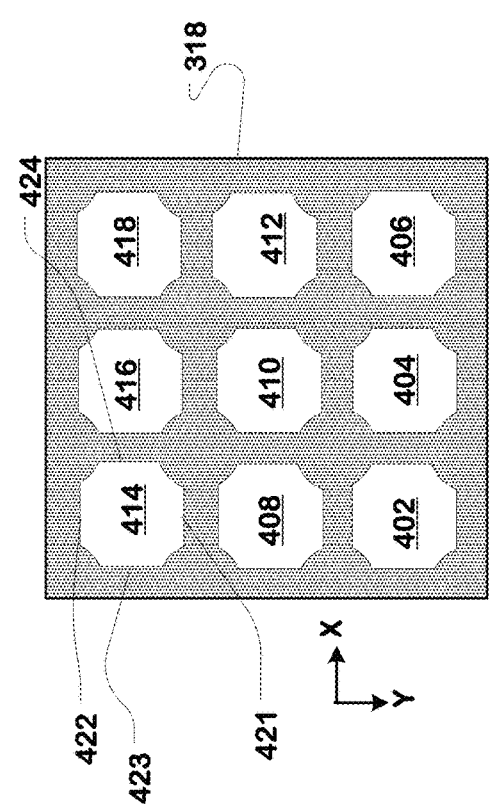
FIG. 4B
FIG. 4C
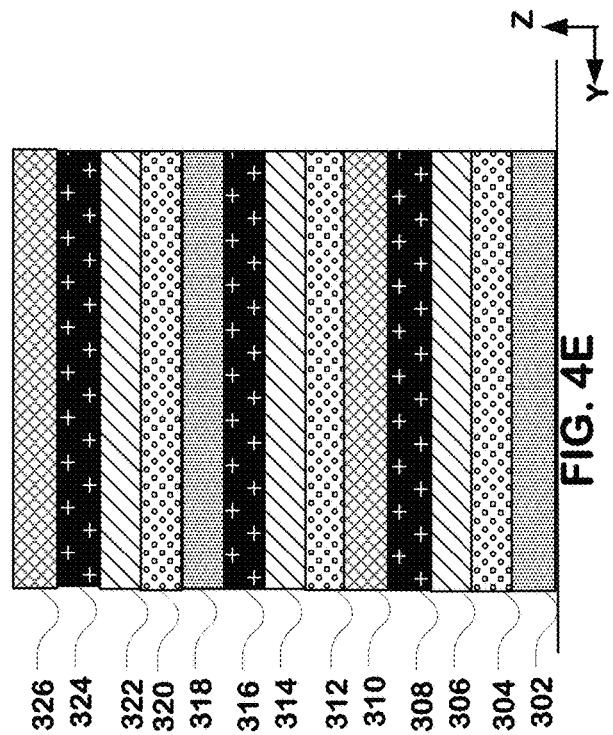
FIG. 4D
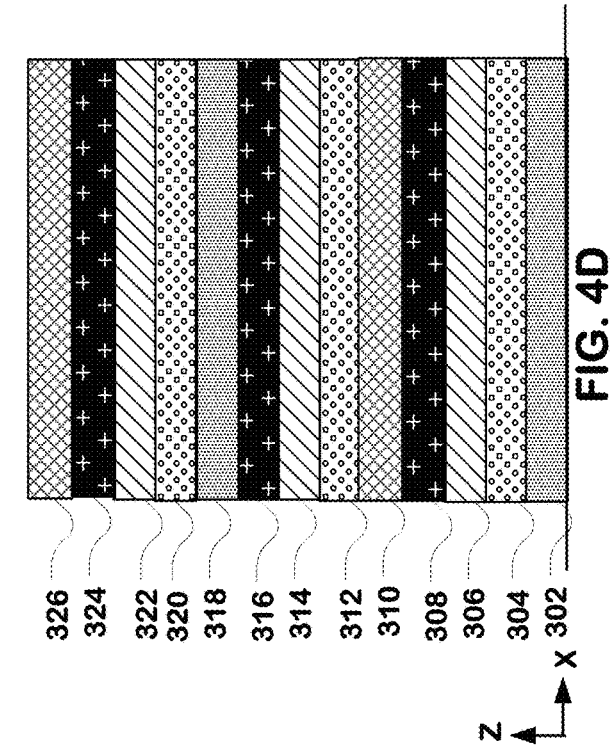
FIG. 4E

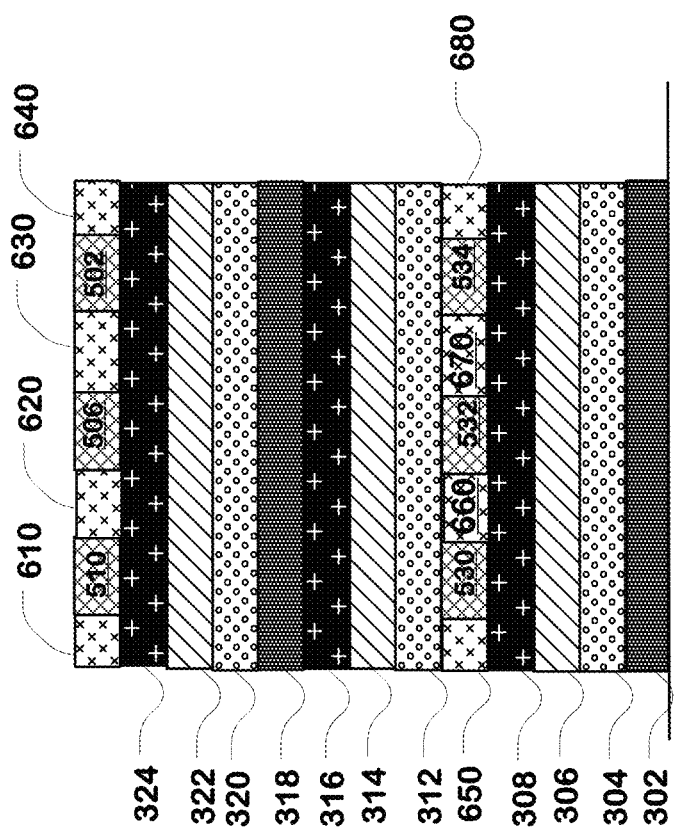
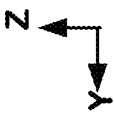
FIG. 6D
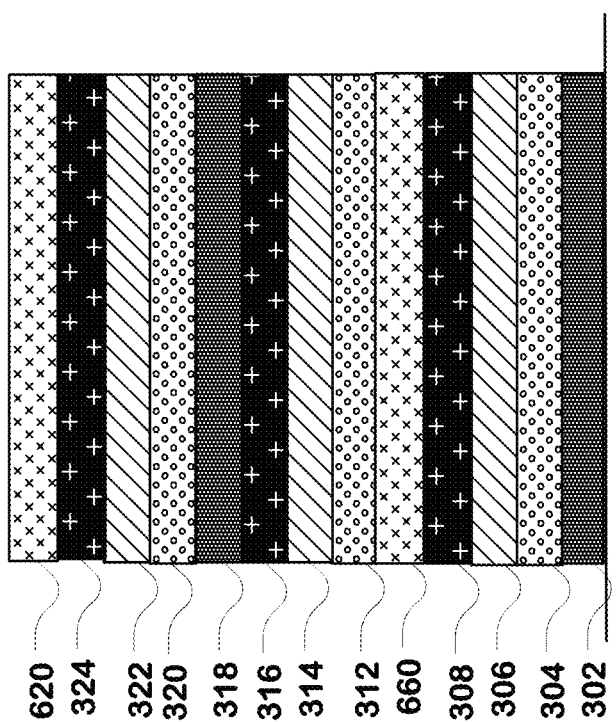
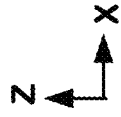
FIG. 6C

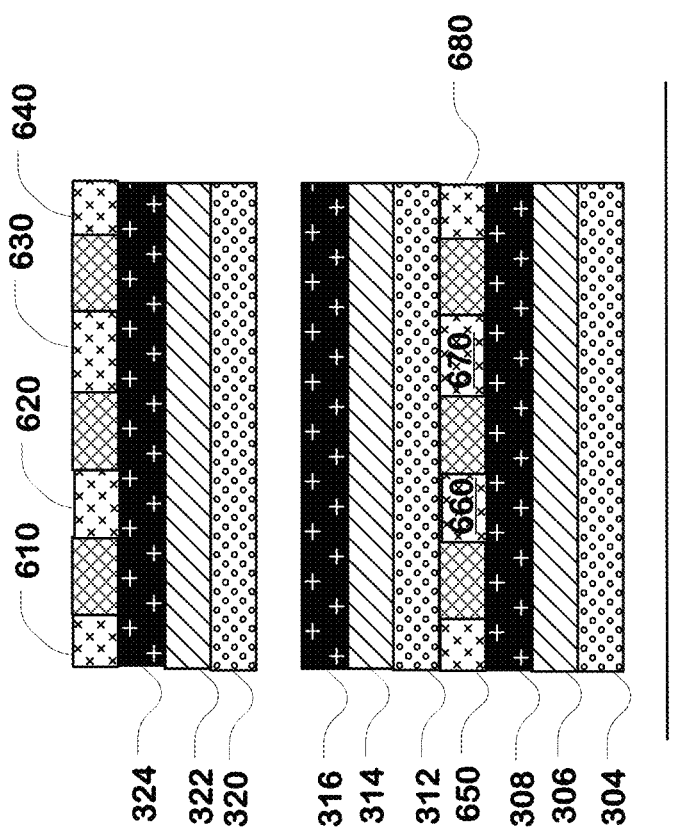
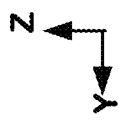
FIG. 7D
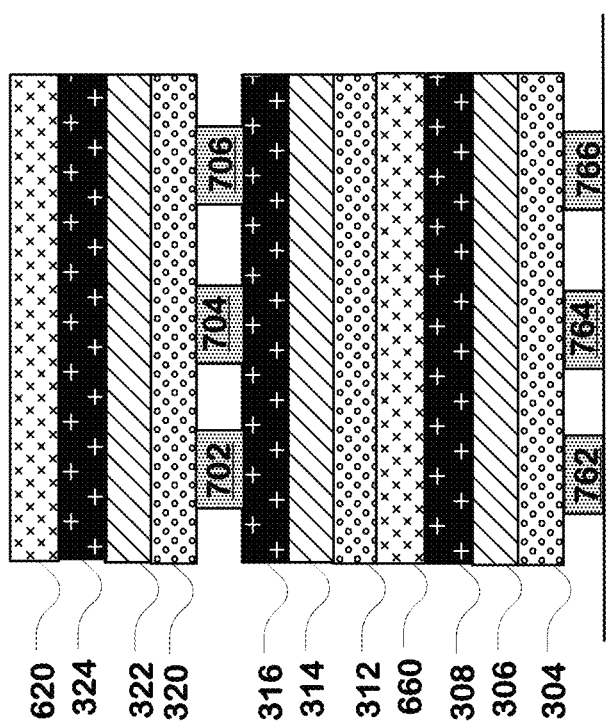
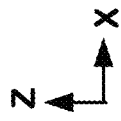
FIG. 7C

LAYER COST SCALABLE 3D PHASE CHANGE CROSS-POINT MEMORY

PRIORITY APPLICATION

This application claims the benefit of U.S. Provisional Patent Application No. 62/672,595 filed 17 May 2018; which application is incorporated herein by reference.

BACKGROUND

Field

The technology described herein relates to integrated circuit memory technologies, including technologies using programmable resistance memory materials, including phase change materials, in 3D cross-point architectures, and methods for manufacturing such devices.

Description of Related Art

Many three-dimensional (3D) cross-point memory technologies using phase change material, and other programmable resistance materials, have been proposed. For example, Li et al., "Evaluation of $SiO_2$ Antifuse in a 3D-OTP Memory," IEEE Transactions on Device and Materials Reliability, Vol. 4, No. 3, September 2004, describes a polysilicon diode and an antifuse arranged as a memory cell. Sasago et al., "Cross-Point Phase Change Memory with $4F^2$ Cell Size Driven by Low-Contact-Resistivity Poly-Si Diode," 2009 Symposium on VLSI Technology Digest of Technical Papers, pages 24-25, describes a polysilicon diode and a phase change element arranged as a memory cell. Kau et al., "A Stackable Cross Point Phase Change Memory," IEDM09-617, (2009) pages 27.1.1 to 27.1.4, describes a memory post including an ovonic threshold switch OTS as an access device with a phase change element. See also, Lung, U.S. Pat. No. 6,579,760 entitled SELF-ALIGNED, PROGRAMMABLE PHASE CHANGE MEMORY, issued Jun. 17, 2003.

In a 3D cross-point memory, multiple memory cells are vertically stacked upon one another to increase the amount of storage in an area available to store data. The memory cells are disposed at cross-points of an alternating arrangement of first access lines (e.g., bit lines or word lines) and second access lines (e.g., word lines or bit lines).

However, difficulties in manufacturing have limited success of 3D cross-point memories. There are several critical lithography steps for each memory layer. Thus, the number of critical lithography steps needed to manufacture the device is multiplied by the number of layers of memory cells that are implemented in some approaches. Critical lithography steps are expensive to implement.

As the need for higher and higher memory capacity in integrated circuit memories continues to increase, it is desirable to provide a method of manufacturing 3D cross-point memories with a low manufacturing cost while satisfying data retention requirements.

SUMMARY

One aspect of the technology includes a 3D cross-point memory, having a plurality of first access line levels, a plurality of second access line levels and a plurality of memory cell levels. The plurality of the memory cell levels is disposed between corresponding first access line levels and second access line levels. A first access line level in the plurality of first access line levels includes a plurality of first access lines extending in a first direction, and a plurality of remnants of a first sacrificial material. Each remnant of the first sacrificial material is disposed between two first access lines of the plurality of first access lines. A second access line level in the plurality of second access line levels includes a plurality of second access lines extending in a second direction and a plurality of remnants of a second sacrificial material. Each remnant of the second sacrificial material is disposed between two second access lines of the plurality of second access lines. The plurality of second access lines in a second access line level overlays the plurality of first access lines of an adjacent first access line level at cross-points between the first and second access lines. In some embodiments, the first sacrificial material is different than the second sacrificial material.

A memory cell level in the plurality of memory cell levels includes an array of memory pillars disposed in the cross-points between the first access lines and the second access lines in adjacent first and second access line levels. Each memory pillar in the array of memory pillars is separated from other neighboring memory pillars by voids, sometimes called air gaps. The memory pillars include a switch element, or steering device, such as an ovonic threshold switch, in series with a programmable memory element comprising a phase change material.

Another aspect of the technology is a method of manufacturing an integrated circuit including a 3D cross-point memory like that described above. The method includes forming a first stack of materials. The first stack of materials includes layers of a first sacrificial material, layers of a programmable memory material, and layers of a second sacrificial material. A plurality of first holes defined by a first hole pattern are etched through the first stack. The first opposing sides of the first holes are covered, and the layers of the first sacrificial material are laterally etched through the uncovered sides of the first holes to form first openings in the first access line levels and a plurality of remnants of the first sacrificial material. A first conducting material is deposited in the first openings. The first holes defined by the first hole pattern are re-etched by a first re-etching process to form a plurality of first access lines extending in the first direction in the first access line levels. The second opposing sides of the re-etched first holes are covered, and the layers of the second sacrificial material are laterally etched through exposed and uncovered sides of the re-etched first holes to form second openings in the second access line levels and a plurality of remnants of the second sacrificial material. A second conducting material is deposited in the second openings. The first holes defined by the first hole pattern are re-etched by a second re-etching process to form a plurality of second access lines extending in the second direction on the second access line levels, the plurality of second access lines crossing over the plurality of first access lines at cross-points between the first and second access lines in adjacent first and second access line levels. The layers of the programmable memory material exposed through the second re-etched first holes are laterally etched to form arrays of memory pillars disposed in the cross-points between the first access lines and the second access lines in the memory cell level in the plurality of memory cell levels. The memory pillars in the array of memory pillars are lined with a dielectric material to form dielectric liners, and voids are formed between memory pillars in the array of memory pillars.

In some embodiments, the first hole pattern comprises an array of holes, the holes having first opposing sides in the second direction and second opposing sides in the first direction. The holes in the first pattern can be a square, a rectangle, a square with notched corners, or other polygons.

In some embodiments, a first direction pattern is used to cover the first opposing sides of the first holes in the second direction while laterally etching the layers of second sacrificial material. The first direction pattern comprises an array of rectangles with the lengths of the rectangles being aligned in the direction of the first access lines. The rectangles in the first direction pattern cover the first opposing sides of the first holes.

In some embodiments, a second direction pattern is used to cover the second opposing sides of the first holes in the first direction while laterally etching the layers of first sacrificial material. The second direction pattern comprises an array of rectangles with the lengths of the rectangles being aligned in the direction of the second access lines. The rectangles in the second direction pattern cover the second opposing sides of the first holes.

In some embodiments, the 3D cross-point memory described herein can be fabricated with five lithography steps: one lithography for defining first holes before the formation of the first and second access lines, one lithography step for defining the first openings and the remnants of the first sacrificial material by lateral etching at multiple levels in the 3D cross-point memory with a tri-layer resist, one lithography step to re-define the first holes after the formation of the first access lines, one lithography step for defining the second openings and remnants of the second sacrificial material by lateral etching at multiple levels in the 3D cross-point memory with a tri-layer resist, and one lithography step for redefining the first holes after the formation of the second access lines. A tri-layer resist may consist of an organic planarization layer (OPL), a silicon-containing anti-reflective coating (SiARC) and a photoresist.

As the number of memory pillars layers increases in 3D cross-point memories, the number of lithographic steps may remain the same, thereby making the fabrication process of the 3D cross-point memory described herein highly scalable. By reducing the number of lithography steps, the average fabrication cost per layer of memory pillars can decrease.

Other features, aspects, and advantages of the technology described herein can be understood with reference to the figures, the detailed description, and the claims set out below.

BRIEF DESCRIPTION OF THE DRAWINGS

FIGS. 3, 4A-4E, 5A-5D, 6A-6D, 7A-7D, 8A-8D, 9A, 9B, 10A, 10B, 11A and 11B illustrate stages of an example manufacturing process flow for manufacturing a 3D cross-point memory with remnants of the first and second sacrificial materials.

DETAILED DESCRIPTION

A detailed description of embodiments of the present technology is provided with reference to the FIGS. 1-13.

Figure 1:
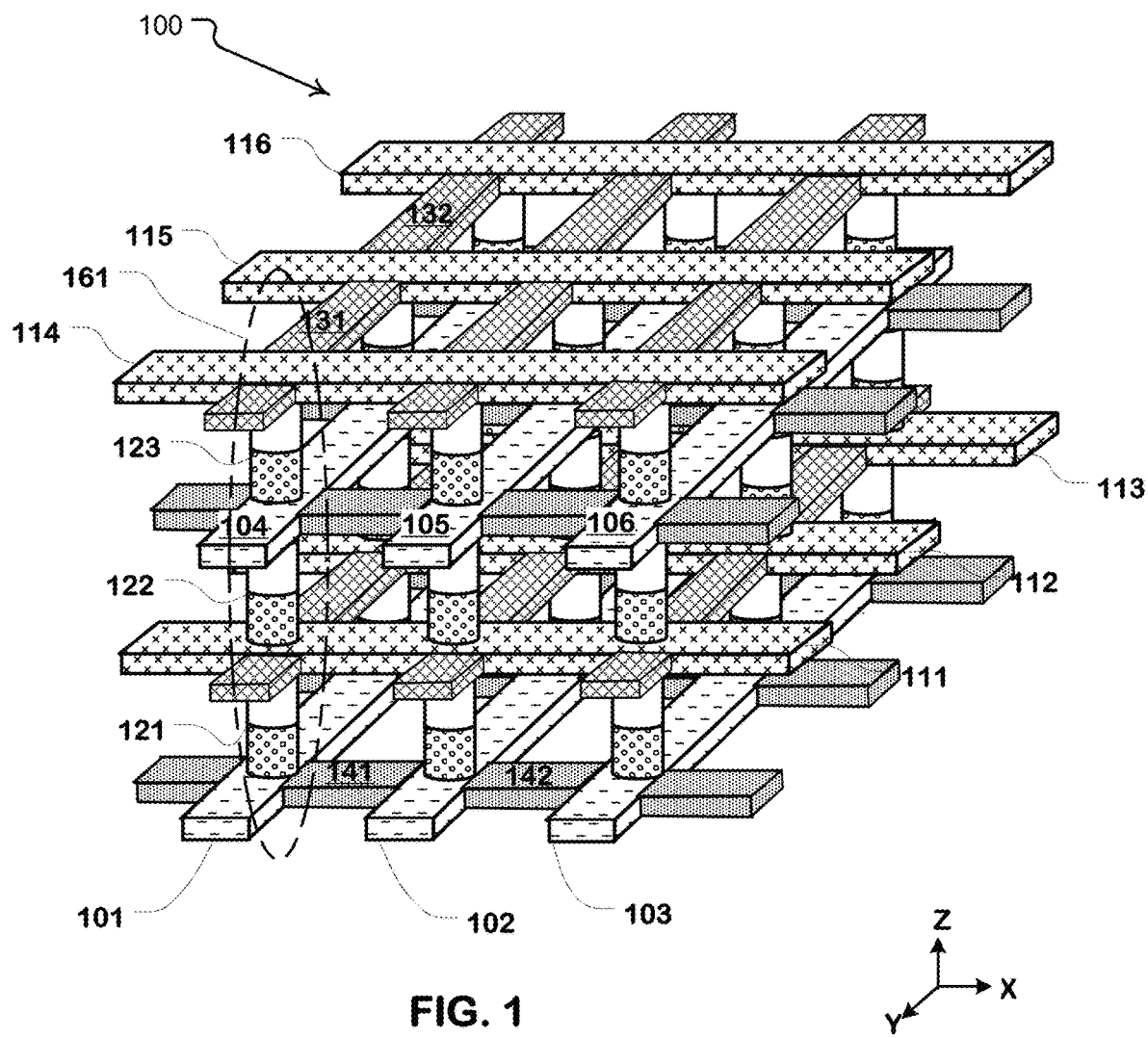
FIG. 1 illustrates a 3D cross-point memory with remnants of the first and second sacrificial materials.
Figure 2:
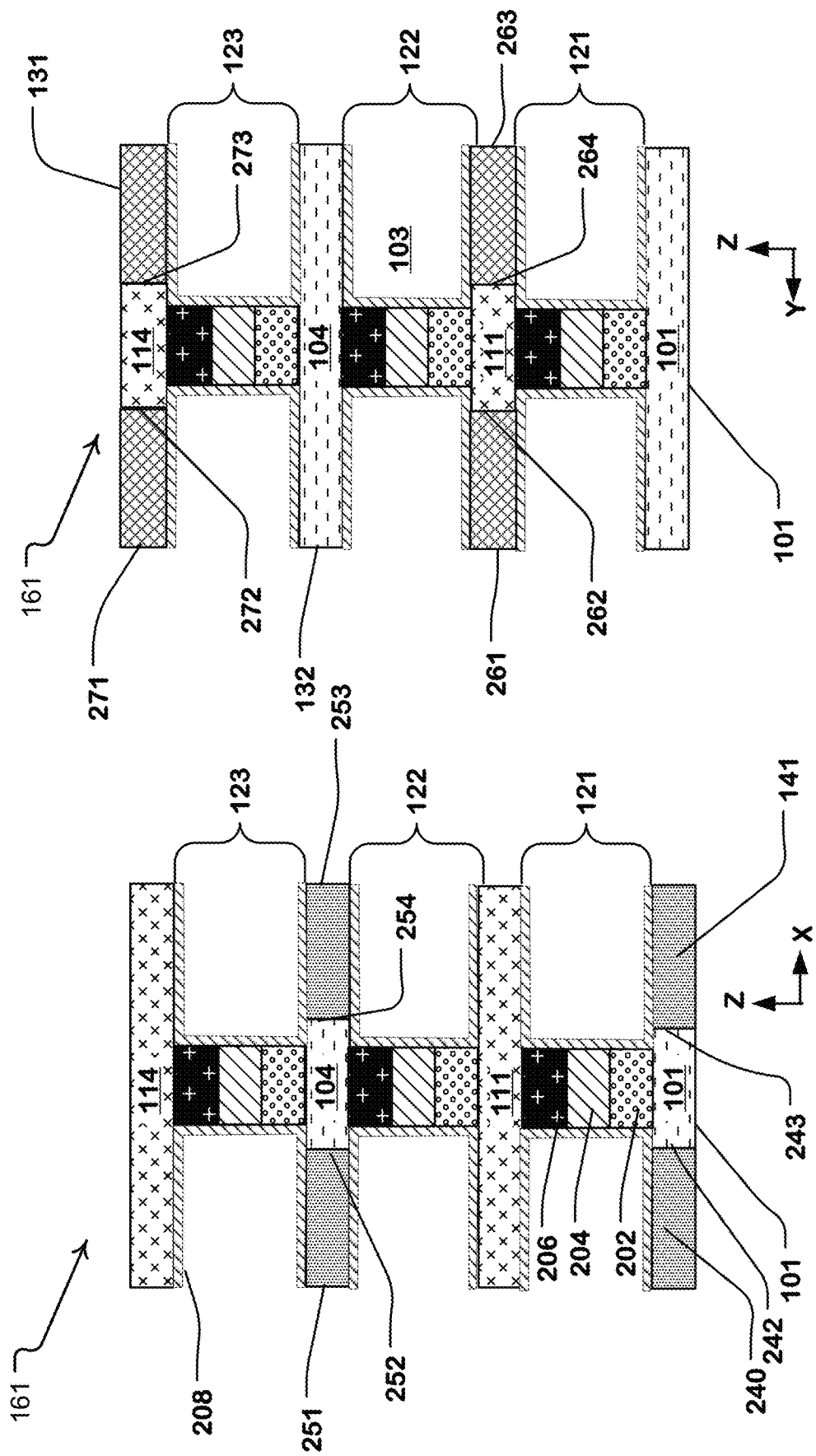
FIGS. 2A and 2B illustrate an X-Z cross-section view and a Y-Z cross-section view of a stack of memory pillars in the 3D cross-point memory in FIG. 1.

FIG. 1 illustrates a 3D cross-point memory 100 with remnants of the first and second sacrificial materials. The 3D cross-point memory 100 includes a plurality of memory cell levels, each memory cell including an array of memory pillars. A "stack" of memory cells, such as stack 161, in a 3D cross-point memory array with M memory cell levels includes M number of memory pillars stacked directly on top of each other. The stack 161 includes the memory pillar 121 at the first level, the memory pillar 122 at the second level and the memory pillar 123 at the third level stacked on top of one another.

The plurality of memory pillars are disposed at cross-points of a plurality of first access lines 101, 102, 103, 104, 105, and 106 extending in a first direction (i.e., the row direction, or the Y direction in FIG. 1), and a plurality of second access lines 111, 112, 113, 114, 115, and 116 extending in a second direction (i.e., the column direction, or the X direction in FIG. 1). The 3D cross-point memory 100 also includes a plurality of remnants of the first sacrificial material and a plurality of remnants of the second sacrificial material. Each remnant of the first sacrificial material is disposed between two first access lines. For example, the remnant of the first sacrificial material 141 is disposed between the first access line 101 and the first access line 102. Similarly, the remnant of the first sacrificial material 142 is disposed between the first access line 102 and the first access line 103. Each remnant of the second sacrificial material is disposed between two second access lines. For example, the remnant of the second sacrificial material 131 is disposed between the second access line 114 and the second access line 115. Similarly, the remnant of the second sacrificial material 132 is disposed between the second access line 115 and the second access line 116.

The first direction and the second direction are orthogonal directions or non-parallel directions so that an array of cross points is formed between the overlapping first and second access lines. Each memory pillar is connected to a particular first access line and a particular second access line. For example, the memory pillar 121 is connected to the first access line 101 and the second access line 111, the memory pillar 122 is connected to the first access line 104 and the second access line 111, and the memory pillar 123 is connected to the first access line 104 and the second access line 114.

The 3D cross-point memory implemented in the configuration of FIG. 1 can have many levels of memory cells, and many first access lines and second access lines in each level for the formation of very high density memories. A 3D cross-point memory with multiple levels of memory cells has a plurality of first access line levels and a plurality of second access line levels interleaved with the first access line levels. Each first access line level includes a plurality of first access lines and a plurality of first non-conductive remnants, and each second access line level includes a plurality of second access lines and a plurality of second non-conductive remnants. The 3D cross-point memory in FIG. 1 comprises three levels of memory cells, two first access line levels, and two second access line levels. The consecutive levels of memory cells share either a first access line level or a second access line level. The first level of memory cells in the 3D cross-point memory is interposed between a first access line level, including the first access lines 101, 102, and 103, and a second access line level, including the second access lines 111, 112, and 113. The second level of memory cells in the 3D cross-point memory is interposed between a second access line level, including the second access lines 111, 112, and 113, and a first access line level, including the first access lines 104, 105, and 106. The third level of memory cells in the 3D cross-point memory is interposed between a first access line level, including the first access lines 104, 105, and 106, and a second access line level, including the second access lines 114, 115, and 116. Other 3D configurations can be implemented.

The first access lines 101, 102, 103, 104, 105, and 106 and the second access lines 111, 112, 113, 114, 115 and 116 comprise a conducting material. The conducting material can comprise a variety of metals, metal-like materials, doped semiconductor access lines, or combinations thereof. Examples of first and second conducting materials include tungsten (W), aluminum (Al), copper (Cu), titanium nitride (TiN), tantalum nitride (TaN), tungsten nitride (WN), doped polysilicon, cobalt silicide (CoSi), Tungsten silicide (WSi), TiN/W/TiN, and other materials.

The remnants of the first sacrificial material comprise a first sacrificial material and the remnants of the second sacrificial material comprise a second sacrificial material. The first and second sacrificial materials can comprise germanium, silicon, silicon nitride, silicon dioxide, silicon-germanium or other germanium-based material. In some embodiments, the first sacrificial material is different than the second sacrificial material in order to support lateral etch processes that are selective between the sacrificial materials. In such embodiments, the first sacrificial material can be selectively etched with a first set of etchants while the second sacrificial material can be selectively etched with a second set of etchants.

The 3D cross-point memory includes access lines coupled to, and in electrical communication with, a first access line decoder (not shown in FIG. 1) and a second access line decoder (not shown in FIG. 1), where the first and second access line decoders can include drivers and bias voltage selectors to apply bias voltages to selected and unselected first access lines and second access lines in the write or read operation. Sense amplifiers (not shown in FIG. 1) can be configured to connect to the first access lines or second access lines. In embodiments of the technology described herein, the sense amplifiers are coupled to one of the first and second access lines on which current source circuits, such as current mirror based load circuits, are connected that limit current during read and write operations.

In some embodiments of a 3D cross-point memory, a plurality of conductor layers is stacked along a first direction and a second direction, each conductor layer including conductor lines. A plurality of memory elements is located between the conductor layers at the cross point of the conductor lines. In some embodiments, the width of each conductor line is larger at the region close to the corresponding memory element than the region far away from the corresponding memory element. In some embodiments, the conductor lines are isolated by an insulating material, such as silicon nitride. In some embodiments, the 3D cross-point memory further comprises at least one insulating layer, such as silicon oxide, between the conductor layers and the surrounding memory elements. In some embodiments, the insulating layers include a plurality of air gaps, wherein the air gaps surround the memory elements. In some embodiments, the memory elements are phase change memory pillars, and each phase change memory pillar may include a selector layer, a barrier layer, and a phase change material.

FIG. 2A illustrates an X-Z cross-section view of the stack 161 of memory pillars in the 3D cross-point memory in FIG. 1. The stack 161 includes the memory pillar 121 at the first level, the memory pillar 122 at the second level and the memory pillar 123 at the third level stacked on top of one another. The memory pillars 121, 122 and 123 are at cross-points between two first access line levels and two second access line levels.

The memory pillar 121 at the first level is interposed between the first access line 101 extending in the first direction (i.e., Y direction) and the second access line 111 extending in the second direction (i.e., X direction). In the second direction, the remnant of the first sacrificial material 240 is disposed next to the first side 242 of the first access line 101, and the remnant of the first sacrificial material 141 is disposed next to the second side 243 of the first access line 101. In the first direction, the remnant of the second sacrificial material 261 is disposed next to the first side 262 of the second access line 111, and the remnant of the second sacrificial material 263 is disposed next to the second side 264 of the second access line 111, as seen in the Y-Z cross-section view of the stack 161 in FIG. 2B.

The memory pillar 122 at the second level is interposed between the second access line 111 and the first access line 104. In the second direction, the remnant of the first sacrificial material 251 is disposed next to the first side 252 of the first access line 104, and the remnant of the first sacrificial material 253 is disposed next to the second side 254 of the first access line 104.

The memory pillar 123 at the third level is interposed between the first access line 104 and the second access line 114. In the first direction, the remnant of the second sacrificial material 271 is disposed next to the first side 272 of the second access line 114, and the remnant of the second sacrificial material 131 is disposed next to the second side 273 of the second access line 114, as seen in the Y-Z cross-section view of the stack 161 in FIG. 2B.

The memory pillars 121, 122, 123, the first access lines 101, 104 and the second access lines 111, 114 can be lined with a dielectric liner 208. Air gaps or voids can be created between neighboring memory pillars. The dielectric liner 208 can include high dielectric constant material, having, for example, a dielectric constant $\kappa>7$, such as $Al_2O_3$, $HfO_2$, $ZrO_2$, $La_2O_3$, AlSiO, HfSiO, and ZrSiO, etc., where $Al_2O_3$ and $HfO_2$ are preferred in some embodiments. The thickness of the high-$\kappa$ dielectric liner can be in the range of 0.1 nm to 20 nm in some embodiments. Thicknesses in a range of 2 nm to 5 nm are preferred in some embodiments.

In some embodiments of the 3D cross-point memory in FIG. 1, each memory pillar comprises a programmable memory element in contact with a first access line, a switch element in contact with a second access line, and a barrier layer between the programmable memory element and the switch element. The memory pillar 121 has a programmable memory element 202 in contact with the first access line 101 and a switch element 206 in contact with the second access line 111. A barrier layer 204 is disposed between the programmable memory element 202 and the switch element 206. In some embodiments of the 3D cross-point memory, the memory pillars are inverted such that the programmable memory elements can be in contact with, or proximal to, a second access line and the switch element can be in contact with, or proximal to, a first access line. In some embodiments, each level can have its own access line layers of first and second access lines. In some embodiments, the memory pillars are not inverted such that the switch elements can be in contact with the first access lines or second access lines.

The programmable memory element 202 can comprise a layer of programmable resistance material. The programmable resistance material can have a first resistive value representing bit "0", and a second resistive value representing bit "1". In some embodiments, more than two resistive values can be used to store multiple bits per cell. In one embodiment, the programmable memory element 202 comprises a layer of phase change memory material as the programmable resistance material.

Phase change materials are capable of being switched between a relatively high resistance state, amorphous phase, and a relatively low resistance state, crystalline phase, by application of energy such as heat or an electrical current. Phase change materials for the programmable memory element 202 can include chalcogenide-based materials and other materials. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be for example $Ge_2Sb_2Te_5$, $GeSb_2Te_4$ and $GeSb_4Te_7$. More generally, a transition metal such as chromium (Cr), iron (Fe), nickel (Ni), niobium (Nb), palladium (Pd), platinum (Pt) and mixtures or alloys thereof may be combined with Ge/Sb/Te or Ga/Sb/Te to form a phase change alloy that has programmable resistive properties. Specific examples of memory materials are disclosed in Ovshinsky, U.S. Pat. No. 5,687,112 at columns 11-13, which examples are incorporated by reference. Various phase change memories are described in U.S. Pat. No. 6,579,760, entitled SELF-ALIGNED, PROGRAMMABLE PHASE CHANGE MEMORY, incorporated by reference herein.

In one embodiment, the programmable memory element 202 may be a resistive random access memory or a ferroelectric random access memory. The programmable resistance material in the programmable memory element 202 may be a metal oxide such as hafnium oxide, magnesium oxide, nickel oxide, niobium oxide, titanium oxide, aluminum oxide, vanadium oxide, tungsten oxide, zinc oxide, or cobalt oxide. In some embodiments, other resistive memory structures can be implemented, such as metal-oxide resistive memories, magnetic resistive memories, conducting-bridge resistive memories, etc.

In some embodiments, the switch element 206 can be a two-terminal, bi-directional ovonic threshold switch (OTS), which comprises a chalcogenide material. In an embodiment including an OTS, a read operation involves applying a voltage across the first access line and second access line that exceeds a threshold of the OTS. In other embodiments, the switch element can comprise other types of devices, including directional devices such as a diode and other bi-directional devices.

In one example, an OTS switch element can comprise a layer of chalcogenide selected for use as an ovonic threshold switch, such as $As_2Se_3$, ZnTe, and GeSe, and has, for example, a thickness of about 5 nm to about 25 nm. In some embodiments, the switch element can comprise a chalcogenide in combination with one or more elements from the group consisting of tellurium (Te), selenium (Se), germanium (Ge), silicon (Si), arsenic (As), titanium (Ti), sulfur (S) and antimony (Sb).

The barrier layer 204 comprises a material or combination of materials selected to provide adequate adhesion between the switch element 206 and the programmable memory element 202, and blocks movement of impurities from the programmable memory element into the switch element and vice versa. The barrier layer can be comprised of conducting or a semiconducting material with a thickness of about 3 to about 30 nm. Appropriate materials for the barrier layer 204 may comprise a metal nitride, for example, titanium nitride (TiN), tantalum nitride (TaN), tungsten nitride (WN), molybdenum nitride (MoN), titanium silicon nitride (TiSiN), titanium aluminum nitride (TiAlN). In addition to metal nitrides, conductive materials, such as titanium carbide (TiC), tungsten carbide (WC), graphite (C), other carbon (C) forms, titanium (Ti), molybdenum (Mo), tantalum (Ta), titanium silicide (TiSi), tantalum silicide (TaSi), and titanium tungsten (TiW), can be used for the barrier layer 204.

FIGS. 3 through 11 illustrate an example manufacturing process flow for a 3D cross-point memory with remnants of the first and second sacrificial materials like that of FIG. 1. The manufacturing process flow includes three patterns: a first hole pattern, a first direction pattern and a second direction pattern. The first hole pattern includes an array of holes, the holes having first opposing sides in the second direction and second opposing sides in the first direction. The holes in the first hole pattern may have a shape of a circle, a square, a square with notched corners, a rectangle, an ellipse, a polygon, etc.

The first direction pattern comprises an array of rectangles, the rectangles having lengths aligned in the direction of the first access lines. The rectangles in the first direction pattern cover the first opposing sides of the holes in the first hole pattern.

The second direction pattern comprises an array of rectangles, the rectangles having lengths aligned in the direction of the second access lines. The rectangles in the second direction pattern cover the second opposing sides of the holes in the first hole pattern.

Figure 3:
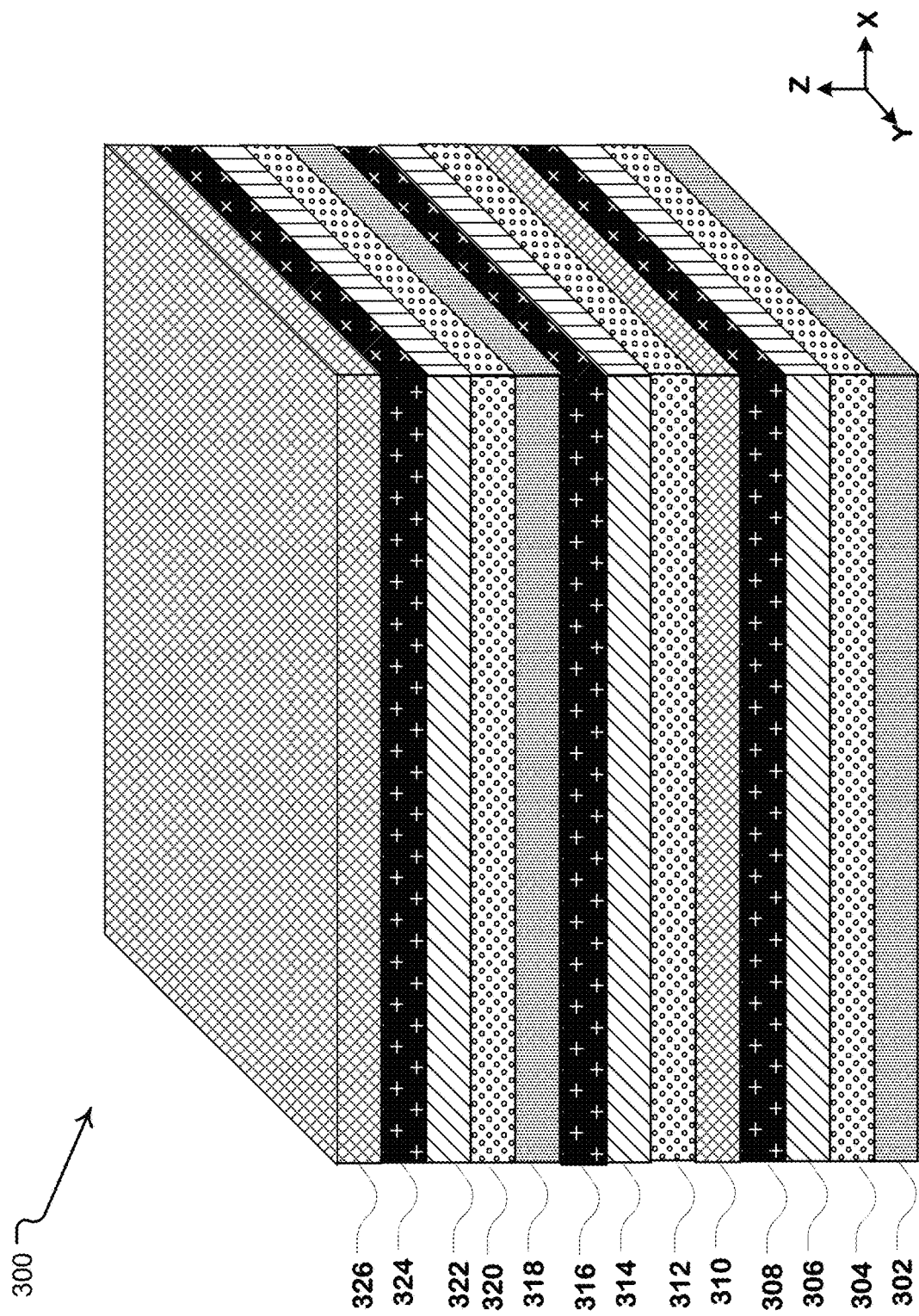

FIG. 3 illustrates a stage in the manufacturing process after forming a first stack 300 of materials with layers 302-326. The first stack 300 can be formed on an integrated circuit substrate or other types of insulating bases. There can be circuitry underlying the first stack 300 in some embodiments. The process of forming the first stack 300 involves depositing a first layer of the first sacrificial material 302, a first layer of materials of the programmable memory element 304, a first layer of materials of the barrier layer 306, a first layer of materials of the switch element 308, a first layer of a second sacrificial material 310, a second layer of materials of the programmable memory element 312, a second layer of materials of the barrier layer 314, a second layer of materials of the switch element 316, a second layer of the first sacrificial material 318, a third layer of materials of the programmable memory element 320, a third layer of materials of the barrier layer 322, a third layer of materials of the switch element 324, and a second layer of a second sacrificial material 326. A 3D cross-point memory with three levels of memory pillars can be formed from the first stack 300.

The first and second sacrificial materials in layers 302, 310, 318 and 326 can comprise germanium, silicon, silicon nitride, silicon dioxide, silicon-germanium or other germanium-based material, the first sacrificial material being different than the second sacrificial material. Other combinations of materials can be utilized. These first and second sacrificial materials can be deposited using, for example, one or more of chemical vapor deposition (CVD), physical vapor deposition (PVD), and atomic layer deposition (ALD) processes.

The materials of the switch element in layers 308, 316 and 324 can comprise materials for an ovonic threshold switch element, such as those described above. In embodiments in which the programmable memory element comprises phase change material, the layers of materials of the switch element 308, 316 and 324 can be deposited by physical vapor deposition (PVD), sputtering, or a magnetron-sputtering method, for example. Alternatively, the layer also can be formed using chemical vapor deposition (CVD) and atomic layer deposition (ALD).

The materials of the barrier layer in layers 306, 314 and 322 can comprise a variety of barrier materials selected in accordance with the programmable resistance memory element, such as those described above. These materials of the barrier layer can be deposited using, for example, one or more of chemical vapor deposition (CVD), physical vapor deposition (PVD), and atomic layer deposition (ALD) processes.

The materials of the programmable memory element in layers 304, 312 and 320 can comprise a variety of phase change materials, such as those described above. These materials of the programmable memory element can be deposited using, for example, one or more of chemical vapor deposition (CVD), physical vapor deposition (PVD), and atomic layer deposition (ALD) processes.

Figure 4A:
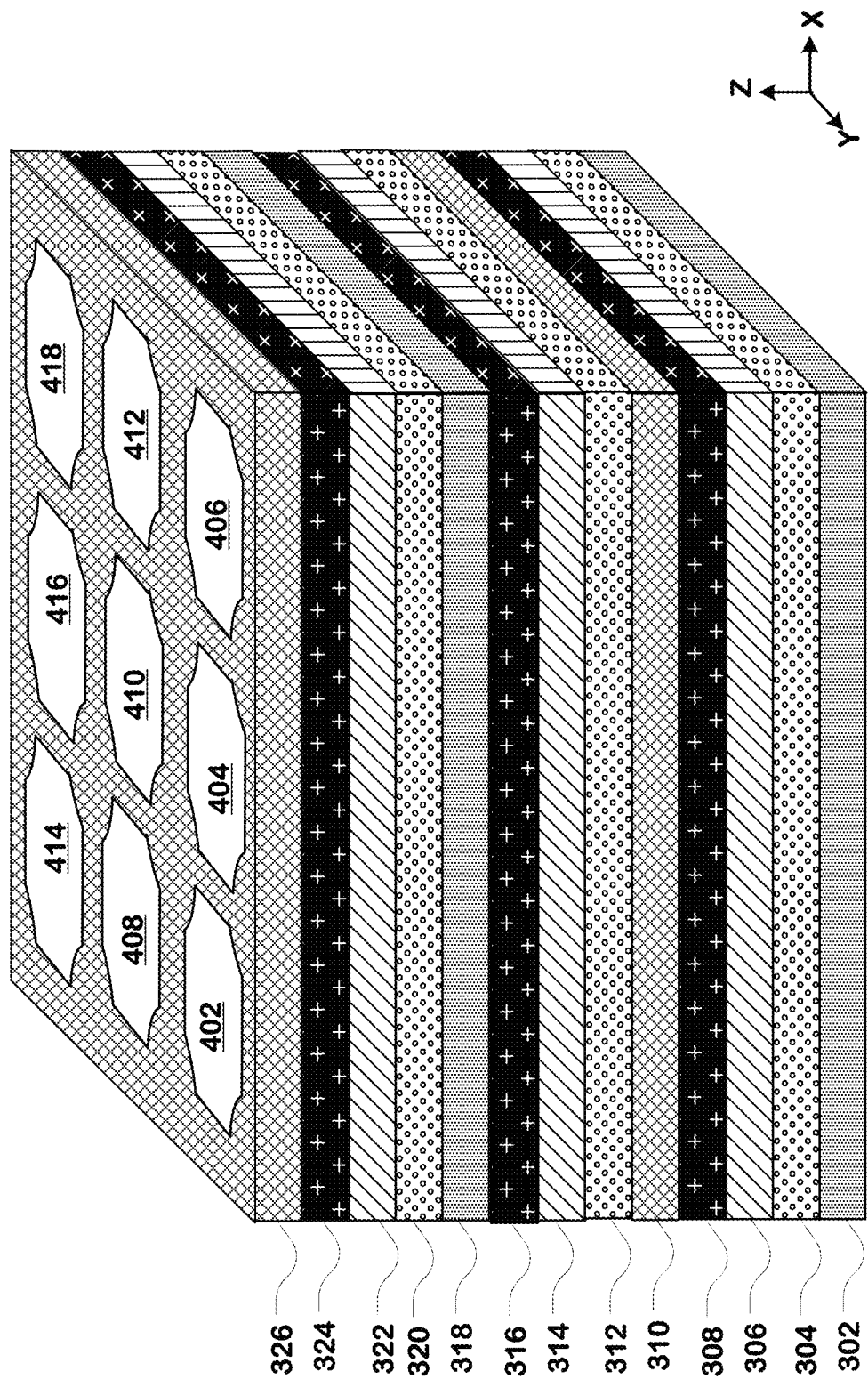

FIG. 4A illustrates a stage in manufacturing after patterning the first stack 300 to define an array of holes through the stack to the substrate in this embodiment with the first hole pattern. The array of holes includes a plurality of first holes 402, 404, 406, 408, 410, 412, 414, 416 and 418. FIGS. 4B and 4C illustrate the X-Y layouts of the second layer of a first sacrificial material 318 and the second layer of the second sacrificial material 326, respectively. As illustrated in FIGS. 4B and 4C, the array of holes is formed using the first hole pattern to define the plurality of first holes 402, 404, 406, 408, 410, 412, 414, 416 and 418. The first hole pattern illustrated in FIGS. 4A-4C is an array of squares with notched corners; however, other hole pattern shapes, such as a square, a circle or a polygon, can also be used. As illustrated in FIG. 4B, a first hole 414 has first opposing sides 423, 424 in the first direction and second opposing sides 421, 422 in the first direction. The first hole pattern defines first holes with first opposing sides (e.g., 423, 424) in the second direction and second opposing sides (e.g., 421,422) in the first direction. The patterning of the plurality of first holes can be done by a lithography process of depositing a photoresist on the first stack, exposure of a first pattern in the photoresist, remove areas of exposed photoresist, etching areas not protected by photoresist and removing the photoresist after etching. FIGS. 4D and 4E illustrate cross-sections of the first stack 300 taken at lines AA' and BB' in FIG. 4C, respectively.

Figure 5B:
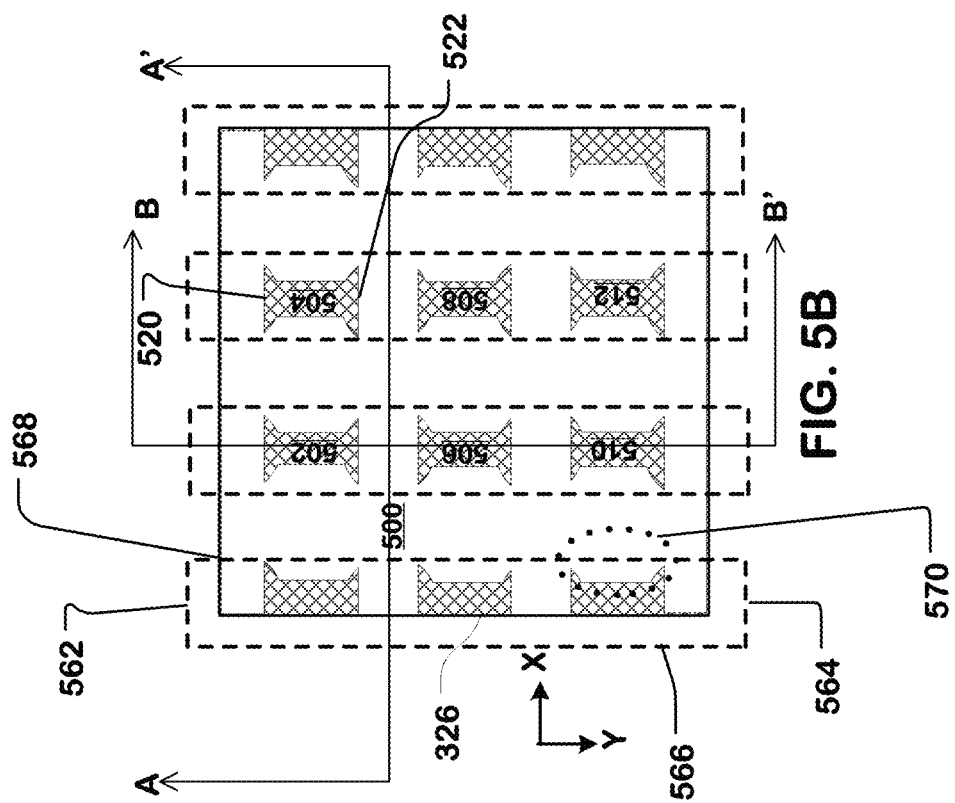
Figure 5A:
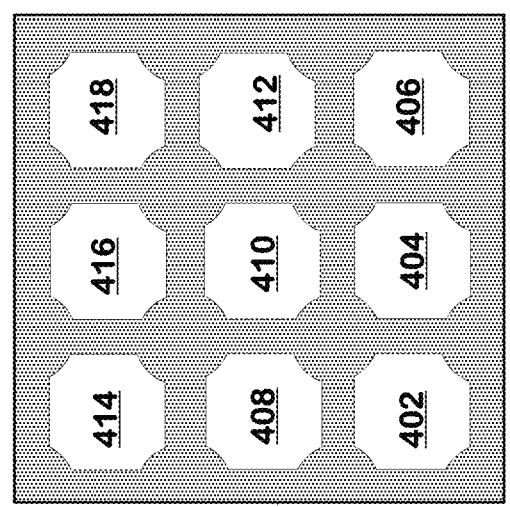

FIGS. 5A and 5B illustrate the X-Y layouts of the second layer of the first sacrificial material 318 and the second layer of the second sacrificial material 326, respectively, after completion of the selective lateral etching in the second direction through the plurality of first holes in the first and second layers of the second sacrificial material 310 and 326. In particular, to result in the structure of FIGS. 5A-5B, a lithography process with a tri-layer resist can be performed. The lithography process consists of filling an organic planarization material in the first holes, depositing a silicon-containing anti-reflective coating (SiARC) and a photoresist on the first stack, exposure of a first direction pattern in the photoresist, removing areas of exposed photoresist, etching areas not protected by photoresist and along the second direction, and removing the photoresist, SiARC, and organic planarization material after etching.

The first direction pattern is used to etch the first and second layers of the second sacrificial material 310 and 326 in the second direction. As illustrated in FIG. 5B, the first direction pattern comprises an array of rectangles, the rectangles having first sides 562, 564 in the first direction and second sides 566, 568 in the second direction. The lengths of the rectangles in the first direction pattern are aligned in the direction of the first access lines. The first opposing sides of the first holes are covered by the second sides of the rectangles in the first direction pattern.

Lateral etch masks are formed in the covered regions, such as region 570, between the first holes and the rectangles in the first direction pattern. The lateral etch masks prevent the second sacrificial materials between two horizontally placed first holes from being etched. However, any second sacrificial material in the second direction and not protected by the first direction pattern and the lateral etch masks are etched out.

Selective etching in the second direction creates a second opening 500, and a plurality of remnants of the second sacrificial material 502, 504, 506, 508, 510 and 512 in the second layer of the second sacrificial material 326. The sides of the remnants of the second sacrificial material 502, 504, 506, 508, 510 and 512, such as sides 520 and 522 of the remnant of the second sacrificial material 504, are defined by the sides of the second access lines to be formed in the next step. Similarly, remnants of the second sacrificial material are formed in the first layer of the second sacrificial material 310. The selective lateral etching of the second sacrificial material does not significantly etch the first, second and third layers of materials of the programmable memory element 304, 312, 320, or the layers of the first sacrificial material 302, 318.

Figure 5D:
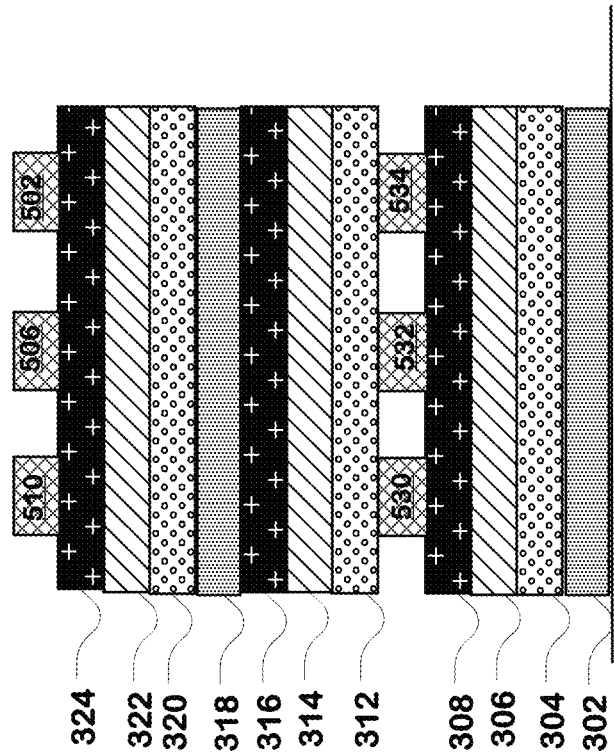
Figure 5C:
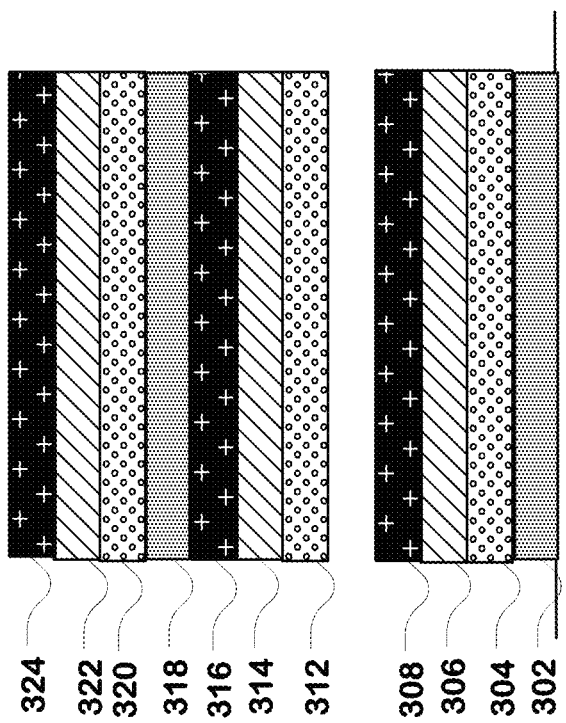

FIG. 5C illustrates the cross-sections of the first stack 300 taken at line AA' (second direction) FIG. 5B. As seen in FIG. 5C, the second sacrificial material in the second direction are etched out by the selective etching process. FIG. 5D illustrates the cross-section of the first stack 300 taken at line BB' (first direction) in FIG. 4B. A plurality of remnants of the second sacrificial material 510, 506, 502, 530, 532, 534 is created after the selective etching process of the second sacrificial material in the second direction.

Figure 6B:
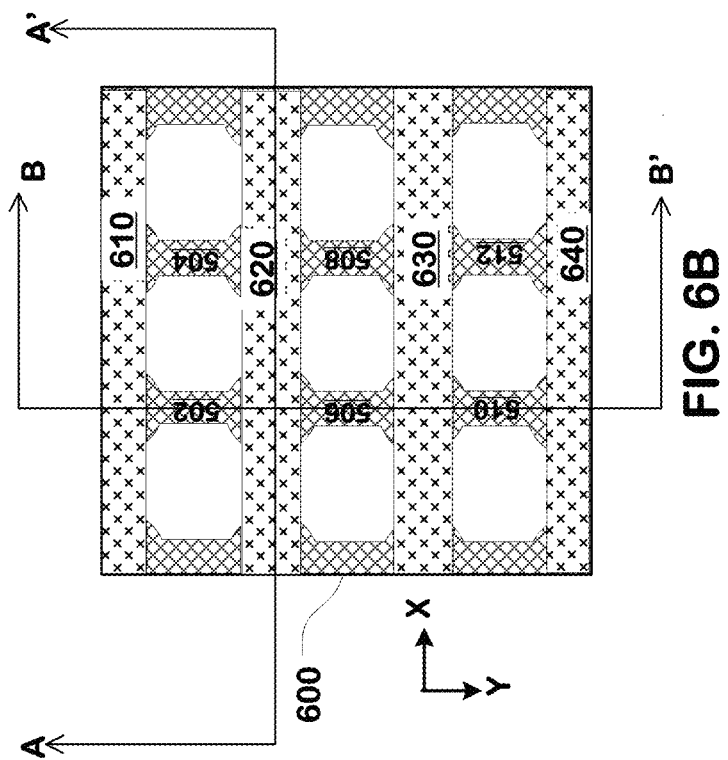
Figure 6A:
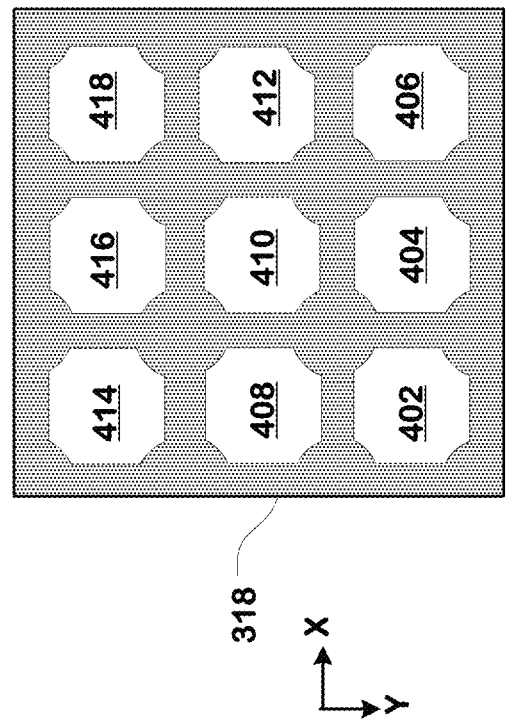

FIGS. 6A and 6B illustrate a stage in manufacturing after completion of the deposition of a second conducting material in the second opening 500 and re-etching the first holes with the first hole pattern to form a plurality of second access lines (e.g., second access lines 610, 620, 630, 640). FIGS. 6A and 6B illustrate the X-Y layouts of the second layer of the first sacrificial material 318 and a second access line level 600 formed from the layer of second sacrificial material 326 including second access lines having sides defined by the perimeter of the selective lateral etch at the last step and re-etching of the first holes. The second conducting material can be tungsten (W), aluminum (Al), copper (Cu), titanium nitride (TiN), tantalum nitride (TaN), tungsten nitride (WN), doped polysilicon, cobalt silicide (CoSi), Tungsten silicide (WSi), TiN/W/TiN, and other conducting materials. The second conducting material can be deposited using a spin-on process, CVD, ALD, PVD, LPCVD, and HDPCVD, for example. The patterning of the plurality of first holes can be done by a lithography process with the first hole pattern.

As illustrated in FIG. 6B, after deposition of the second conducting material and re-etching of the first holes, a plurality of second access lines (e.g., second access lines 610, 620, 630, 640) are formed. The remnants of the second sacrificial material 502, 504, 506, 508, 510, and 512 are disposed between the second access lines. For example, the remnants of the second sacrificial material 502 and 504 are disposed between the second access line 610 and the second access line 620 in the second access line level 600. Similarly, a second access line level including a plurality of second access lines is formed from the first layer of the second sacrificial material 310.

FIG. 6C illustrates the cross-sections of the first stack 300 taken at line AA' (second direction) FIG. 6B. As seen in FIG. 6C, a second access line 620 is formed above the layer of materials of the switch element 324 and another second access line 660 is formed between the layer of materials of the switch element 308 and the layer of the programmable memory element 312. The second access lines 620 and 660 are extended in the second direction. FIG. 6D illustrates the cross-section of the first stack 300 taken at line BB' (first direction) in FIG. 6B. A plurality of remnants of the second sacrificial material 510, 506, 502, 530, 532, 534 is disposed between the second access lines 610, 620, 630, 640, 650, 660, 670, 680.

Figure 7B:
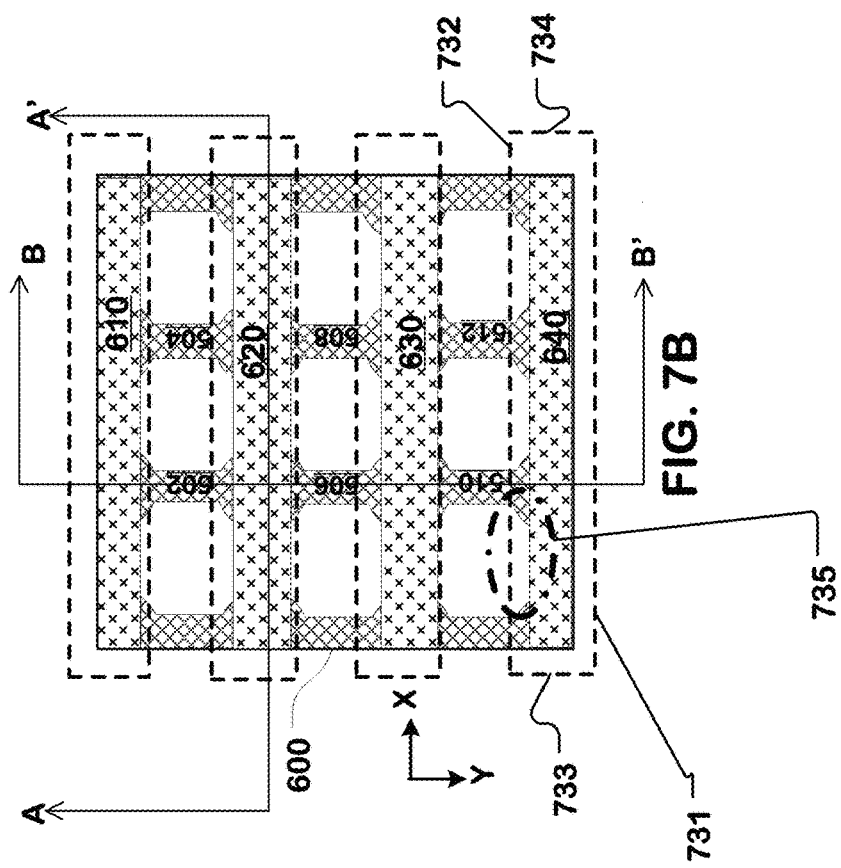
Figure 7A:
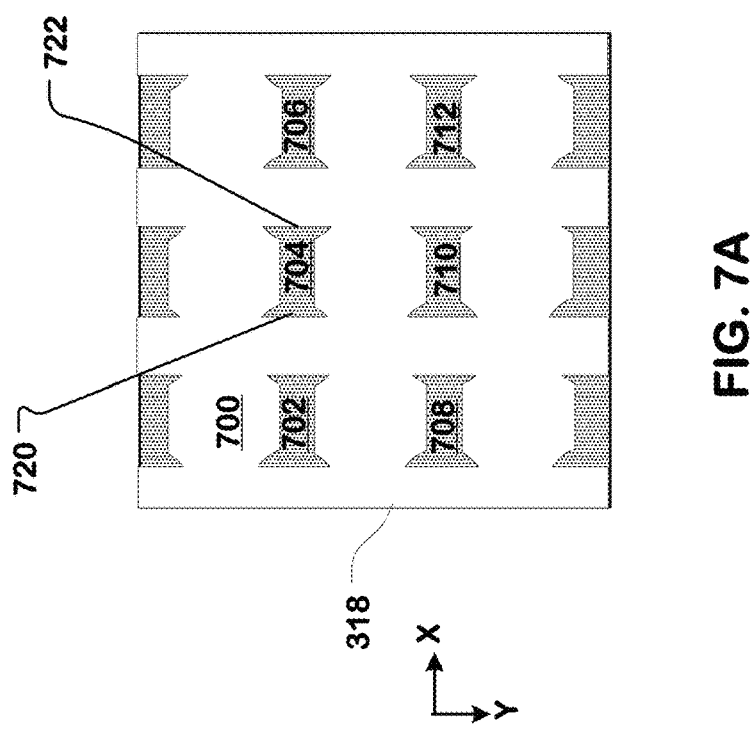

FIGS. 7A and 7B illustrate the X-Y layouts of the second layer of the first sacrificial material 318, and the second access line level 600, respectively, after completion of the selective lateral etching in the first direction through the plurality of first holes in the first and second layers of the first sacrificial material 302 and 318.

In particular, to result in the structure of FIGS. 5A-5B, a lithography process with a tri-layer resist can be performed. The lithography process consists of filling an organic planarization material in the first holes, depositing a silicon-containing anti-reflective coating (SiARC) and a photoresist on the first stack, exposing the second direction pattern in the photoresist, removing areas of exposed photoresist, etching areas not protected by photoresist and along the second direction, and removing the photoresist, SiARC, and organic planarization material after etching.

A second direction pattern is used to etch the first and second layers of the first sacrificial material 302 and 318 in the first direction. As illustrated in FIG. 7B, the second direction pattern comprises an array of rectangles, the rectangles having first sides 731, 732 in the first direction and second sides 733, 734 the second direction. The lengths of the rectangles in the second direction pattern are aligned in the direction of the second access lines. The second opposing sides of the first holes are covered by the first sides of the rectangles in the second direction pattern.

Lateral etch masks are formed in the covered regions, such as region 735, between the first holes and the rectangles in the second direction pattern. The lateral etch masks prevent the first sacrificial materials between two vertically placed first holes from being etched. However, any second sacrificial material in the second direction, and not protected by the second direction pattern and the lateral etch masks, are etched out.

Selective etching in the first direction creates a first opening 700, and a plurality of remnants of the first sacrificial material 702, 704, 706, 708, 710 and 712 in the second layer of the first sacrificial material 318. The sides of the remnants of the first sacrificial material 702, 704, 706, 708, 710 and 712, such as sides 720 and 722 of the remnant of the first sacrificial material 704, are defined by the sides of the first access lines to be formed in the next step. Similarly, remnants of the first sacrificial material are formed in the first layer of the first sacrificial material 302. The selective lateral etching of the first sacrificial material does not significantly etch the first, second and third layers of materials of the programmable memory element 304, 312, 320, or the second access lines and the second non-conductive remnants.

FIG. 7C illustrates the cross-sections of the first stack 300 taken at line AA' (second direction) of FIG. 7B. A plurality of remnants of the first sacrificial material 702, 704, 706, 762, 764, and 766 of the first sacrificial material is created after the selective etching process of the first sacrificial material in the first direction. FIG. 7D illustrates the cross-section of the first stack 300 taken at line BB' (first direction) in FIG. 7B. As seen in FIG. 7D, the first sacrificial material in the first direction is etched out by the selective etching process of the first sacrificial material.

Figure 8B:
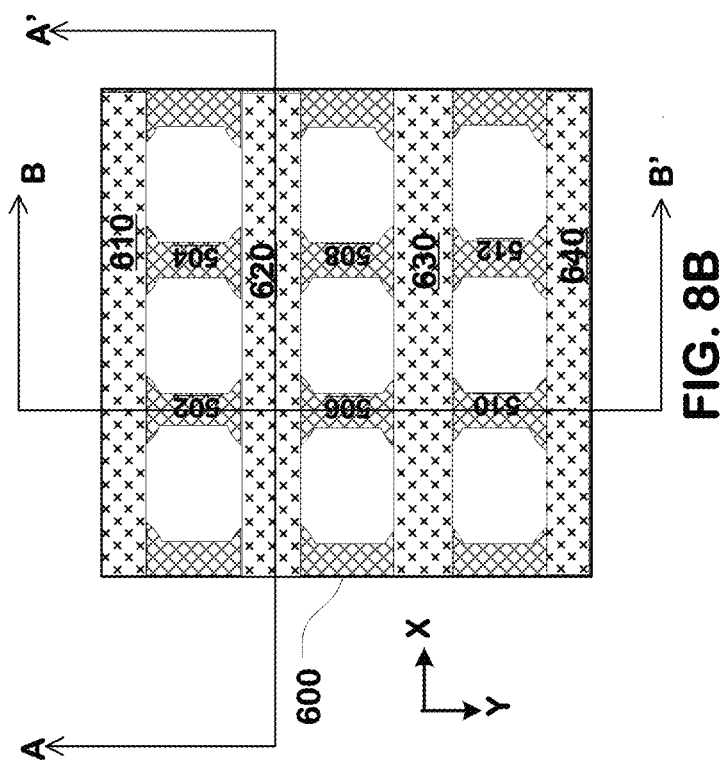
Figure 8A:
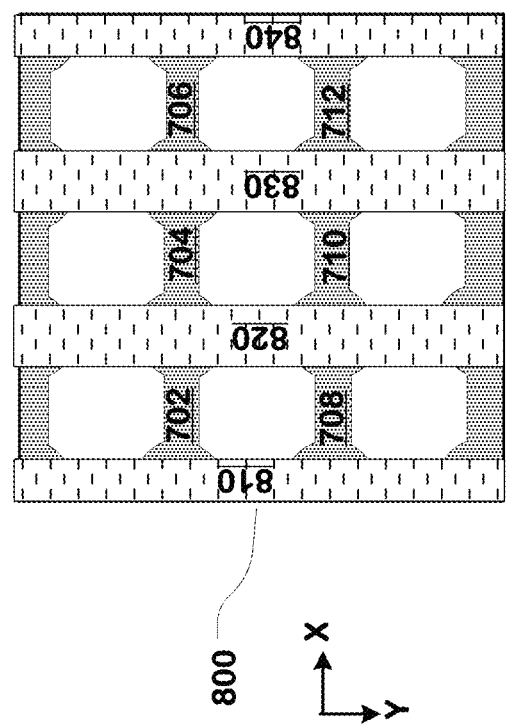

FIGS. 8A and 8B illustrate a stage in manufacturing after completion of the deposition of a first conducting material in the first opening 700 and re-etching the first holes with the first hole pattern to form a plurality of first access lines (e.g., first access lines 810, 820, 830, 840). FIG. 8A illustrates the X-Y layout of a first access line level 800 formed from the layer of the first sacrificial material 318 including first access lines having sides defined by the perimeter of the selective lateral etch in the last step and re-etching of the first holes. FIG. 8B illustrates the second access line level 600. The first conducting material can be tungsten (W), aluminum (Al), copper (Cu), titanium nitride (TiN), tantalum nitride (TaN), tungsten nitride (WN), doped polysilicon, cobalt silicide (CoSi), Tungsten silicide (WSi), TiN/W/TiN, and other conducting materials. The first conducting material can be deposited using a spin-on process, CVD, ALD, PVD, LPCVD, and HDPCVD, for example. The patterning of the plurality of first holes can be done by a lithography process with the first hole pattern.

As illustrated in FIG. 8A, after deposition of the first conducting material and re-etching of the first holes, a plurality of first access lines (e.g., first access lines 810, 820, 830, 840) are formed. The remnants of the first sacrificial material 702, 704, 706, 708, 710, and 712 are disposed between the first access lines. For example, the remnants of the first sacrificial material 702 and 708 are disposed between the first access line 810 and the first access line 820 in the first access line level 800. Similarly, a first access line level including a plurality of first access lines is formed from the first layer of the first sacrificial material 302.

Figures 8C, 8D:
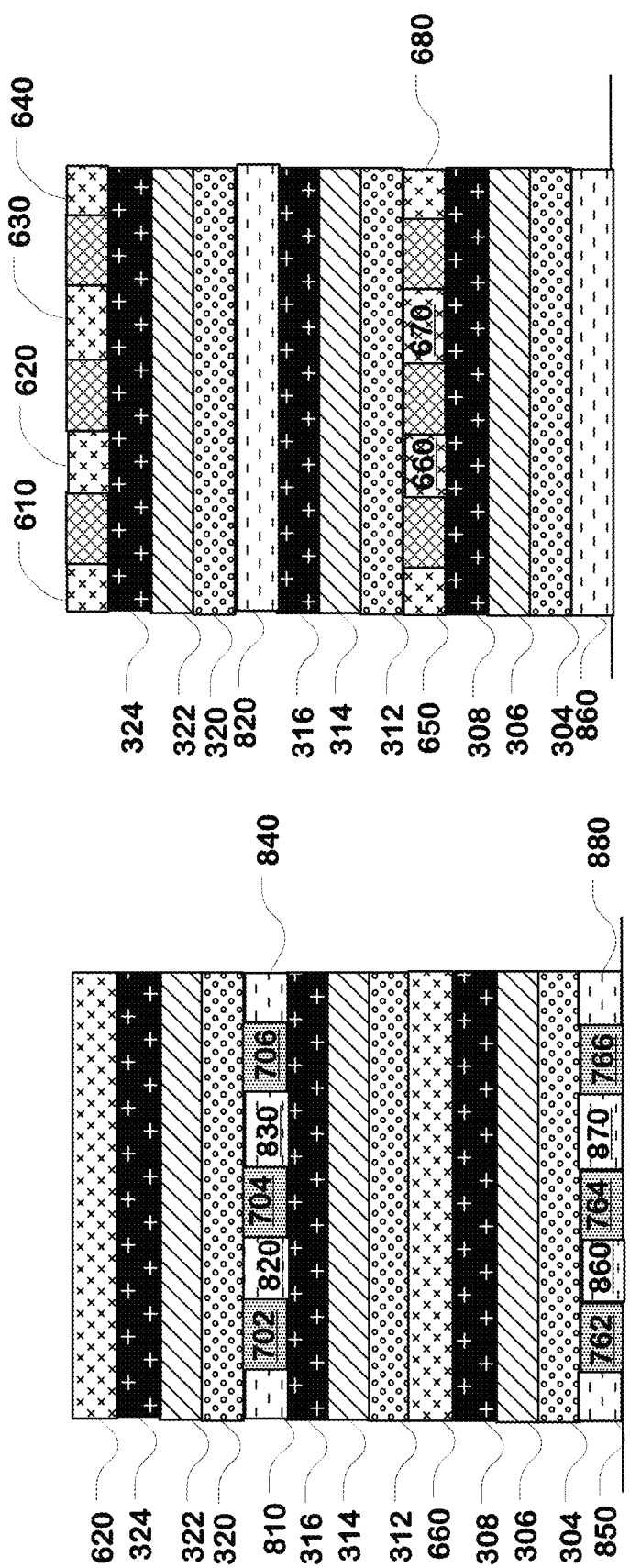

FIG. 8C illustrates the cross-section of the first stack 300 taken at line AA' (second direction) of FIG. 8B. A plurality of remnants of the first sacrificial material 702, 704, 706, 762, 764, 766 are disposed between the first access lines 810, 820, 830, 840, 850, 860, 870, 880. FIG. 8D illustrates the cross-section of the first stack 300 taken at line BB' (first direction) in FIG. 8B. As seen in FIG. 8D, a first access line 820 is formed between the layer of materials of the switch element 316 and the layer of the programmable memory element 320, and another first access line 860 is formed below the layer of the programmable memory element 304. The first access lines 820 and 860 are extended in the first direction.

Figures 9A, 9B:
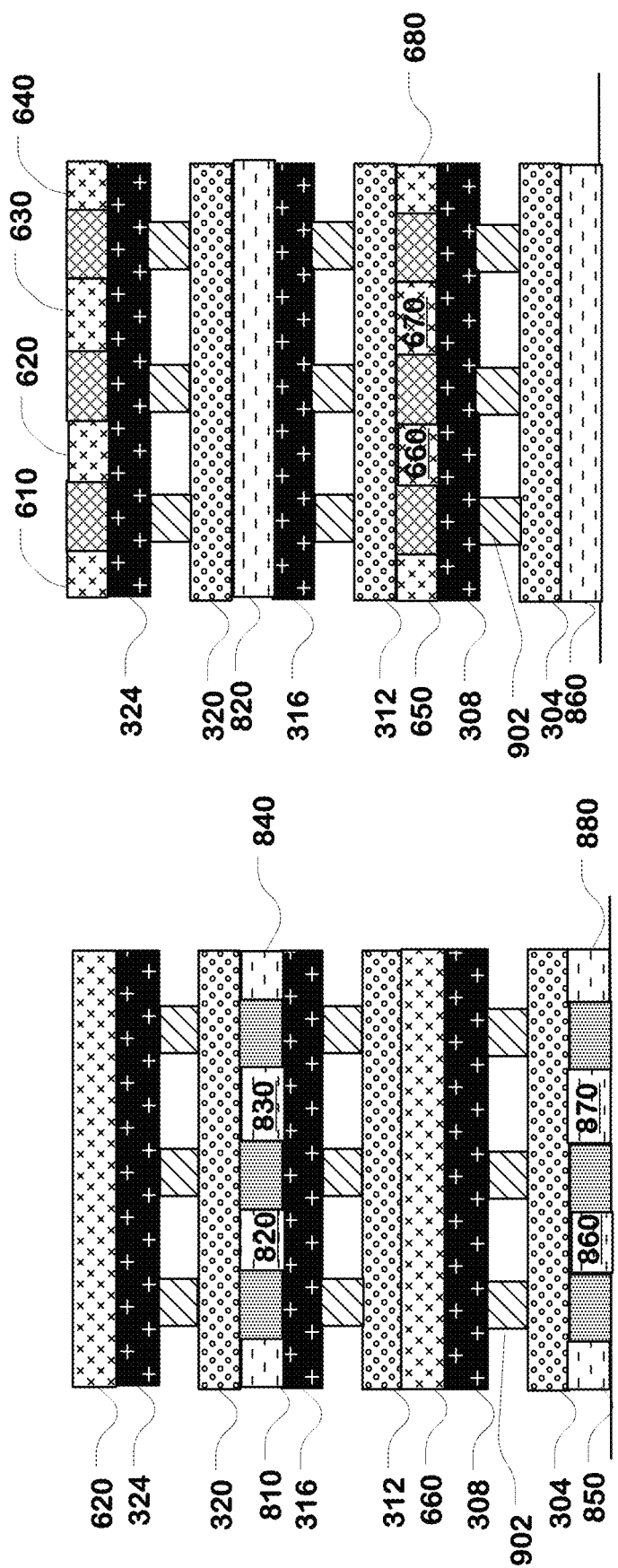

FIGS. 9A and 9B illustrate the X-Z and Y-Z layouts of the first stack, respectively, after completion of the selective lateral etching through the plurality of first holes of the first layer of materials of the barrier layer 306, the second layer of materials of the barrier layer 314, and the third layer of materials of the barrier layer 322. Upon completion of the lateral etch in this stage, barrier layers, such as barrier layer 902, are formed. The sides of the barrier layer pillars are defined by the perimeter of the lateral etch. A reactive-ion etching process can be used to etch layers of materials of the barrier layer 306, 314 and 322.

Figures 10A, 10B:
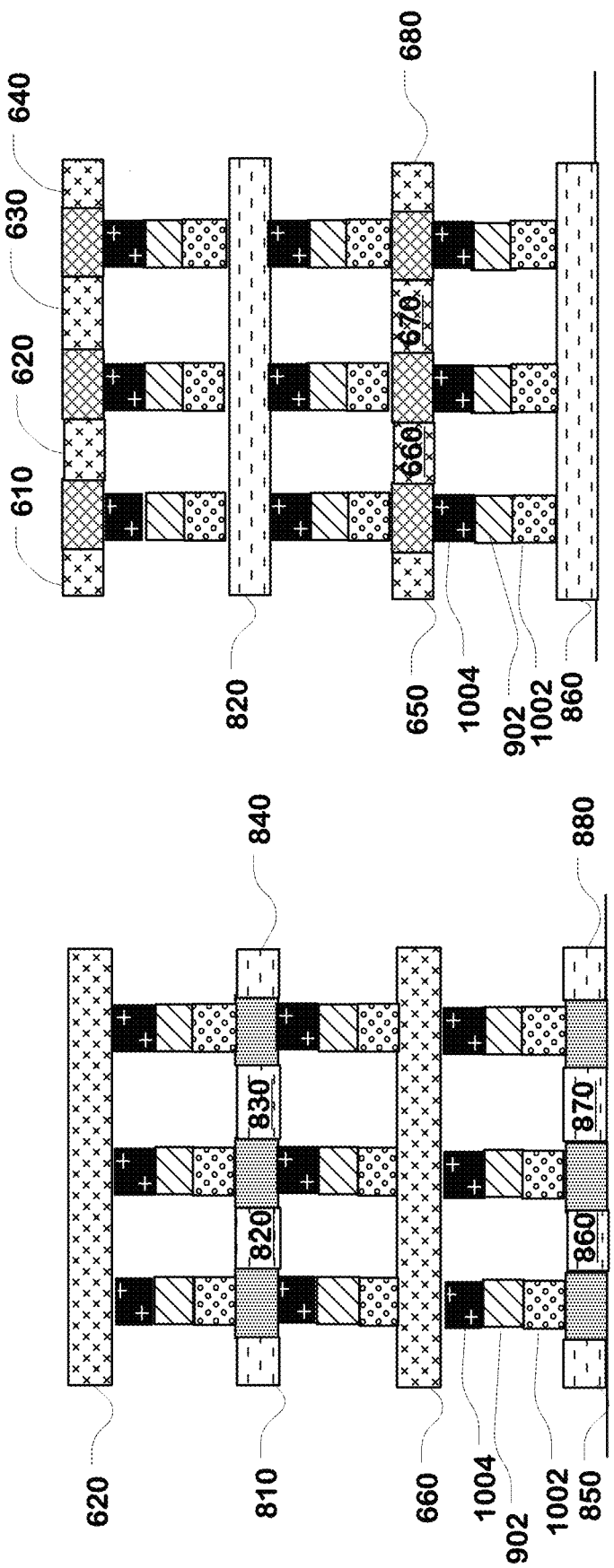

FIGS. 10A and 10B illustrate the X-Z and Y-Z layouts of the first stack, respectively, after completion of the selective lateral etching of the first layer of materials of the programmable memory element 304, the first layer of materials of the switch element 308, the second layer of materials of the programmable memory element 312, the second layer of materials of the switch element 316, the third layer of materials of the programmable memory element 320, and the third layer of materials of the switch element 324 through the first holes to form an array of memory pillars. The sides of the memory cell pillars in the array of memory cell pillars are defined by the perimeter of the selective lateral etch. The memory pillars provide a first level of memory cells including a memory pillar comprising the programmable memory element 1002, the barrier layer 902 and the switch element 1004, as a result of the etching process. Similarly, a second level of memory cells and a third level of memory cells are formed in the second layer of materials of the programmable memory element and the third layer of materials of the programmable memory element, respectively.

Figure 11A:
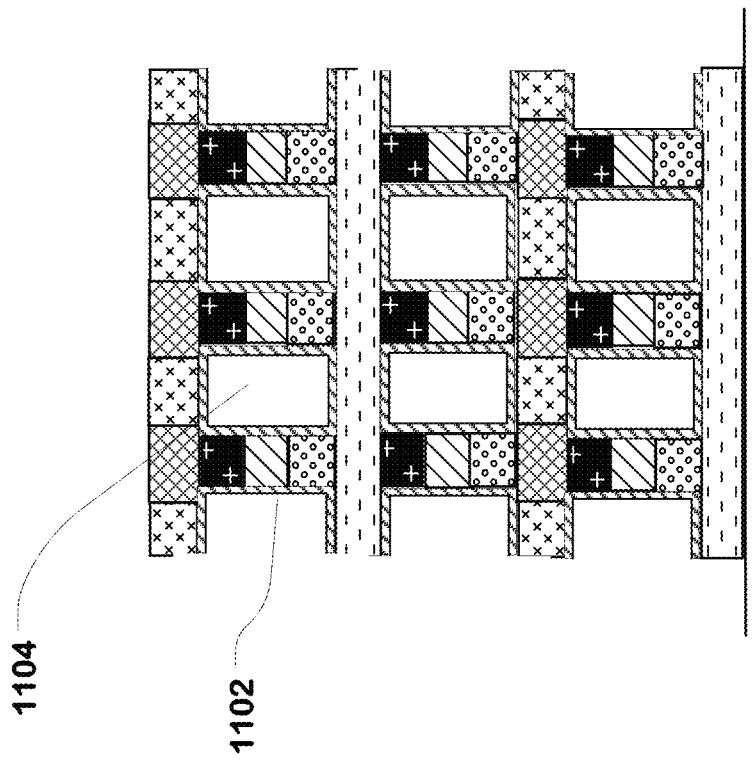
Figure 11B:
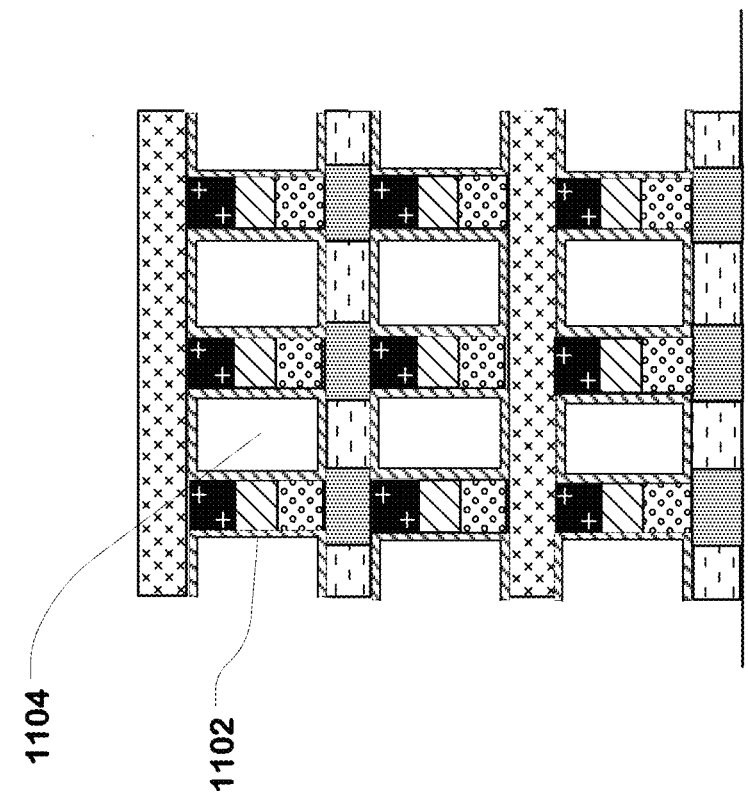

FIGS. 11A and 11B illustrate the X-Z and Y-Z layouts of the first stack, respectively, after lining the exposed surfaces of the memory pillars, first access lines and second access lines with a dielectric material to form dielectric liners 1102, and forming air gaps or voids 1104 between the memory pillars. The dielectric liner 1102 can include high dielectric constant material, having, for example, a dielectric constant κ>7, such as $Al_2O_3$, $HfO_2$, $ZrO_2$, $La_2O_3$, AlSiO, HfSiO, and ZrSiO, etc., where $Al_2O_3$ and $HfO_2$ are preferred in some embodiments. The thickness of the high-κ dielectric liner can be in the range of 0.1 nm to 20 nm in some embodiments. Thicknesses in a range of 2 nm to 5 nm are preferred in some embodiments. A high-κ dielectric liner can be deposited using highly conforming chemical vapor deposition or atomic layer deposition. Voids or "air gaps" can be formed between the memory pillars in the structure between the access lines.

Figure 12:
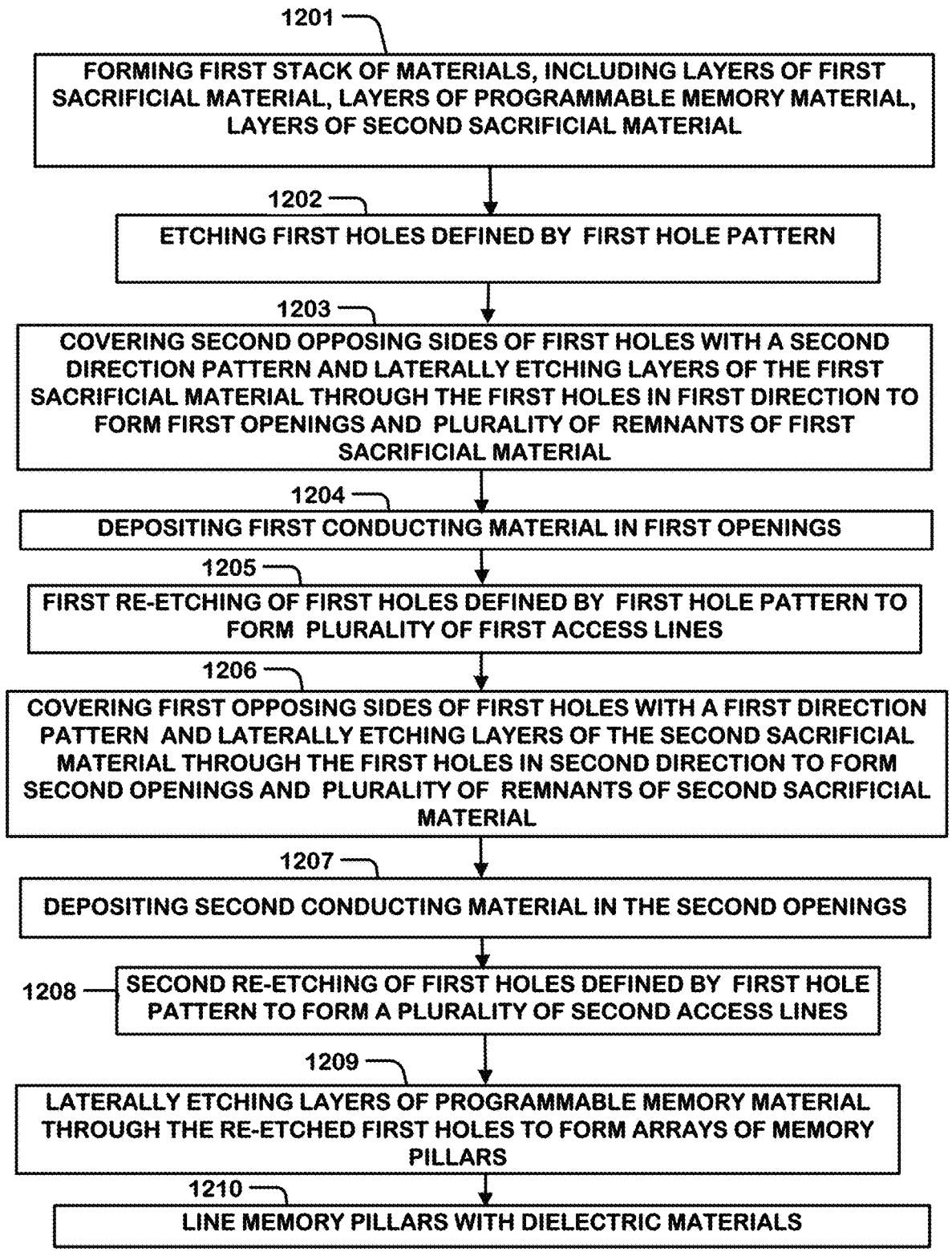
FIG. 12 is a flowchart illustrating a method for manufacturing a memory with a 3D cross-point memory with remnants of the first and second sacrificial materials.

FIG. 12 is a flowchart illustrating a method for manufacturing a 3D cross-point memory with remnants of the first and second sacrificial material. The method includes forming a first stack of materials (e.g., the first stack 300 in FIG. 3) at step 1201. The first stack includes layers of a first sacrificial material, layers of a programmable memory material, layers of materials for the barrier layer, layers of materials for the switch element, and layers of a second sacrificial material (e.g., layers 302-326 in FIG. 3). At step 1202, a plurality of first holes (e.g., first holes 402-418 in FIG. 4) defined by a first hole pattern is etched through the first stack. At step 1203, the second opposing sides of the first holes are covered with a second direction pattern, and the layers of the first sacrificial material are laterally etched through the first holes in a first direction to form first openings (e.g., first opening 700 in FIG. 7A) and a plurality of remnants of the first sacrificial material (e.g., remnants of the first sacrificial material 702-712 in FIG. 7B). At step 1204, a first conducting material is deposited in the first openings, and at step 1205, the first holes are re-etched with the first hole pattern to form a plurality of first access lines (e.g., first access lines 810-840 in FIG. 8A) extending in the first direction. At step 1206, the first opposing sides of the first holes are covered with a first direction pattern and the layers of the second sacrificial material are laterally etched through the first holes in a second direction to form second openings (e.g., second opening 500 in FIG. 5B) and a plurality of remnants of the second sacrificial material (e.g., remnants of the second sacrificial material 502-512 in FIG. 5B) with a first direction pattern. At step 1207, a second conducting material is deposited in the second openings, and at step 1208, the first holes are re-etched with the first hole pattern to form a plurality of second access lines (e.g., second access lines 610, 620, 630, 640 in FIG. 6B) extending in the second direction. The plurality of second access lines crosses over the plurality of first access lines at cross-points between the first and second access lines. At step 1209, the layers of the programmable memory material, the layers of materials for the barrier layer and the layers of materials for the switch element are laterally etched through the first holes to form arrays of memory pillars (e.g., FIG. 10) disposed in the cross-points between the first access lines and the second access line. At step 1210, the sides of the memory pillars are lined with dielectric materials to form dielectric liners (e.g., dielectric liner 1102 in FIG. 11) and air gaps are formed between memory pillars (e.g., air gap 1104 in FIG. 11).

The method includes forming a 3D memory including a plurality of first access line levels, a plurality of second access line levels and a plurality of memory cell levels (FIGS. 1 and 11). The plurality of memory cell levels is disposed between corresponding first access line levels and second access line levels.

The method includes forming a first access line level in the plurality of first access line levels. The first access line levels include a plurality of first access lines extending in a first direction (e.g., first access lines 810, 820, 830, 840 in FIG. 8A), and a plurality of remnants of a first sacrificial material (e.g., remnants of the first sacrificial material 702-712 in FIG. 7B). Each remnant of the first sacrificial material is disposed between two first access lines of the plurality of first access lines.

The method includes forming a second access line level in the plurality of second access line levels. The second access line includes a plurality of second access lines extending in a second direction and crossing over the plurality of first access lines of adjacent first access line levels at cross-points between the first and second access lines (e.g., second access lines 610-640 in FIG. 6B), and a plurality of remnants of a second sacrificial material (e.g., remnants of the second sacrificial material 502-512 in FIG. 5B). Each remnant of the second sacrificial material is disposed between two second access lines of the plurality of second access lines.

The method includes forming a memory cell level in the plurality of memory cell levels including an array of memory pillars disposed in the cross-points between the first access lines and the second access lines in adjacent first and second access line levels (e.g., FIG. 10).

The method further comprises lining the memory pillars in the array of memory pillars with a dielectric material to form dielectric liners (e.g., FIG. 11).

The method further comprises forming air gaps or voids between memory pillars in the array of memory cells (e.g., FIG. 11).

Another example manufacturing method comprises forming a stack of a first dummy layer, a memory layer and a second dummy layer; forming holes through the stack; processing the photolithography step to form a plurality of first protect lines on the stack; selected etching to remove the partial region of the first dummy layer to form a plurality of first elongated openings along a first direction; filling in the first conductor material into the first elongated openings;

processing the photolithography step to form a plurality of second protect lines on the stack; selected etching to remove the partial region of the second dummy layer to form a plurality of second elongated openings along a second direction; filling in the second conductor material into the second elongated openings selected etching the memory layer to form the memory elements; and filling the dielectric material into the holes.

Figure 13:
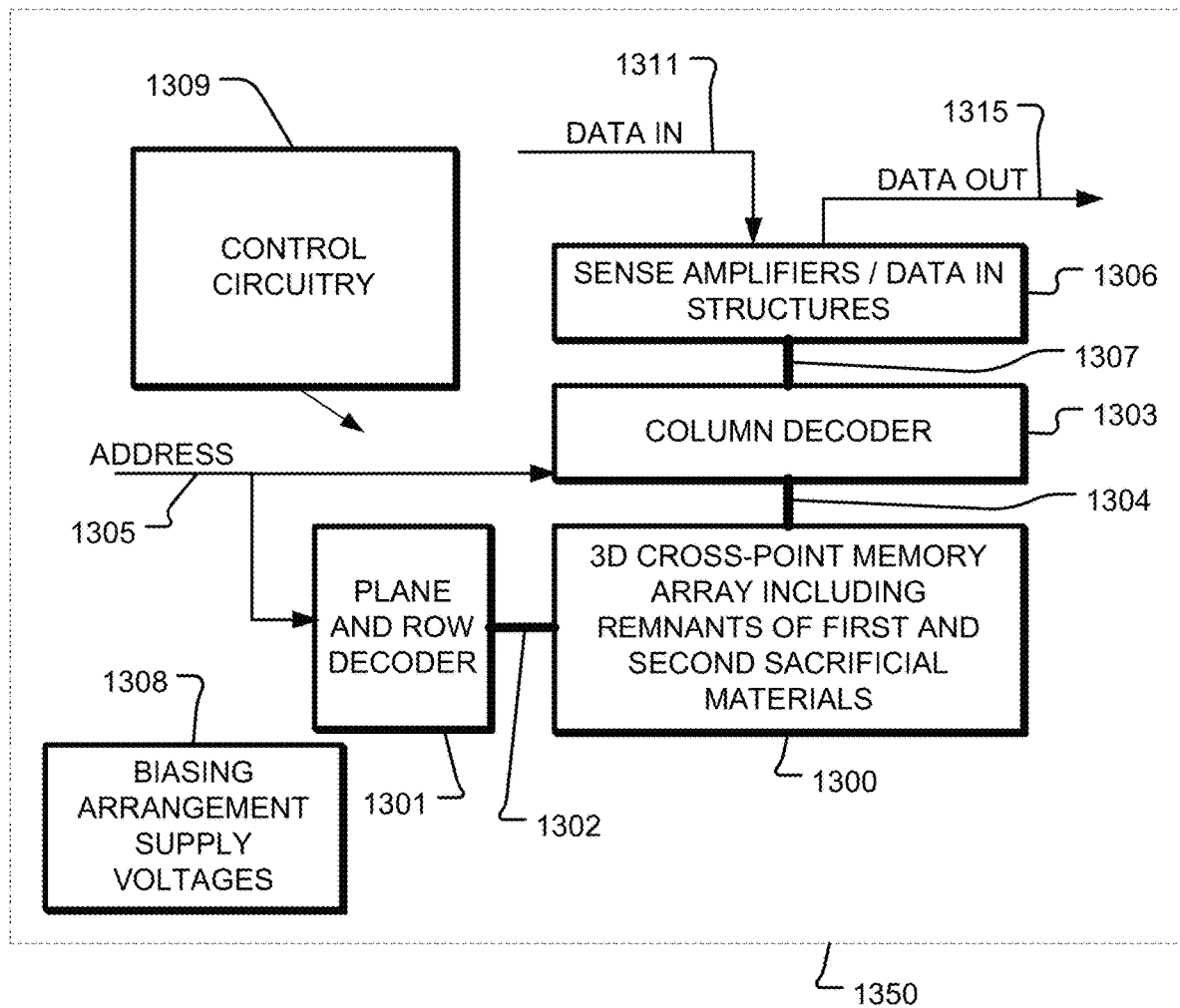
FIG. 13 is a simplified block diagram of an integrated circuit according to an embodiment of the present invention.

FIG. 13 shows an integrated circuit 1350 including a 3D cross-point memory array 1300 comprising memory pillars, first and second access lines and remnants of the first and second sacrificial materials as described herein. A plane and row decoder 1301 is coupled to, and in electrical communication with, a plurality of first access lines 1302, and arranged along rows in the 3D cross-point memory array 1300. A column decoder 1303 is coupled to, and in electrical communication with, a plurality of second access lines 1304 arranged along columns in the 3D cross-point memory array 1300 for reading data from, and writing data to, the memory pillars in the 3D cross-point memory array 1300. Addresses are supplied on bus 1305 to the plane and row decoder 1301 and to the column decoder 1303. Sense amplifiers and other supporting circuitry such as pre-charge circuits and so on, along with data-in structures in block 1306, are coupled to the column decoder 1303 via the bus 1307. Data is supplied via the data-in line 1311 from input/output ports on the integrated circuit 1350 or other data sources, to the data-in structures in block 1306. Data is supplied via the data-out line 1315 from the sense amplifiers in block 1306 to input/output ports on the integrated circuit 1350, or to other data destinations internal or external to the integrated circuit 1350. A bias arrangement state machine is in control circuitry 1309, controlling biasing arrangement supply voltages 1308, and the sense circuitry and the data-in structures in block 1306, for read and write operations. The control circuitry 1309 can be implemented using special purpose logic, a general purpose processor or a combination thereof, configured to execute the read, write and erase operations.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A device, comprising:
   a 3D memory including a stack including a plurality of first access line levels interleaved with a plurality of second access line levels and a plurality of memory cell levels, the plurality of memory cell levels being disposed between corresponding first access line levels and second access line levels;
   a first access line level in the plurality of first access line levels including a plurality of first access lines extending in a first direction, and a plurality of remnants of a first sacrificial material, each remnant of the first sacrificial material disposed between two first access lines of the plurality of first access lines;
   a second access line level in the plurality of second access line levels including a plurality of second access lines extending in a second direction and crossing over the plurality of first access lines of adjacent first access line levels at cross-points between the first and second access lines, and a plurality of remnants of a second sacrificial material, each remnant in the plurality of remnants of the second sacrificial material extending in the first direction between two second access lines of the plurality of second access lines, and superposing first access lines in underlying first access line levels of the stack; and
   a memory cell level in the plurality of memory cell levels including an array of memory pillars disposed in the cross-points between the first access lines and the second access lines in adjacent first and second access line levels,
   the first sacrificial material being different than the second sacrificial material.

2. The device of claim 1, wherein each memory pillar in the array of memory pillars includes a switch element, a barrier layer, and a programmable memory element in series.

3. The device of claim 2, wherein the programmable memory element comprises a phase change material.

4. The device of claim 2, wherein the switch element comprises an ovonic threshold switch.

5. The device of claim 2, wherein a memory cell level of the plurality of memory cell levels includes voids surrounding the memory pillars in the array of memory pillars.

6. The device of claim 1, wherein each memory pillar has sidewalls defined by a perimeter of selective lateral etch of the memory cell level between adjacent first and second access line levels.

7. The device of claim 1, further comprising dielectric liners lining the memory pillars in the array of memory pillars, the dielectric liners comprising a dielectric material.

8. A method of manufacturing an integrated circuit, comprising:
   forming a 3D memory including a stack including a plurality of first access line levels interleaved with a plurality of second access line levels and a plurality of memory cell levels, the plurality of memory cell levels being disposed between corresponding first access line levels and second access line levels;
   forming a first access line level in the plurality of first access line levels including a plurality of first access lines extending in a first direction, and a plurality of remnants of a first sacrificial material, each remnant of the first sacrificial material disposed between two first access lines of the plurality of first access lines;
   forming a second access line level in the plurality of second access line levels including a plurality of second access lines extending in a second direction and crossing over the plurality of first access lines of adjacent first access line levels at cross-points between the first and second access lines, and a plurality of remnants of a second sacrificial material, each remnant in the plurality of remnants of the second sacrificial material extending in the first direction between two second access lines of the plurality of second access lines, and superposing first access lines in underlying first access line levels of the stack; and
   forming a memory cell level in the plurality of memory cell levels including an array of memory pillars disposed in the cross-points between the first access lines and the second access lines in adjacent first and second access line levels,
   the first sacrificial material being different than the second sacrificial material.

9. The method of claim 8, wherein forming the plurality of first access lines, the plurality of remnants of the first sacrificial material, the plurality of second access lines, the plurality of remnants of the second sacrificial material and the plurality of memory cell levels, comprises:

forming a first stack of materials, including layers of a first sacrificial material, layers of a programmable memory material, layers of a second sacrificial material;

etching first holes defined by a first hole pattern through the first stack;

covering first opposing sides of the first holes in the second direction, and laterally etching the layers of the first sacrificial material exposed through uncovered sides of the first holes to form first openings in the first access line levels and a plurality of remnants of the first sacrificial material;

depositing a first conducting material in the first openings;

first re-etching of the first holes defined by the first hole pattern through the first stack to form a plurality of first access lines extending in the first direction in the first access line levels;

covering second opposing sides of the re-etched first holes in the first direction, and laterally etching the layers of the second sacrificial material through exposed uncovered sides of the re-etched first holes to form second openings in the second access line levels and a plurality of remnants of the second sacrificial material;

depositing a second conducting material in the second openings;

second re-etching of the first holes defined by the first hole pattern through the first stack to form a plurality of second access lines extending in the second direction of the second access line levels, the plurality of second access lines crossing over the plurality of first access lines at cross-points between the first and second access lines in adjacent first and second access line levels; and laterally etching the layers of the programmable memory material exposed through the second re-etched first holes to form arrays of memory pillars disposed in the cross-points between the first access lines and the second access line in the memory cell level in the plurality of memory cell levels.

10. The method of claim 9, further comprising forming voids between memory pillars in the array of memory pillars.

11. The method of claim 9, the first conducting material being the same as the second conducting material.

12. The method of claim 9, wherein each memory pillar in the array of memory pillars further includes a switch element and a barrier layer and the first stack of materials further includes a layer of materials of the switch element and a layer of materials of the barrier layer.

13. The method of claim 9, wherein:

covering first opposing sides of the first holes in the second direction includes depositing mask material in the first holes, and etching the mask material in the first holes according to a first direction pattern to form lateral etch masks on the first opposing sides; and covering second opposing sides of the re-etched first holes in the first direction includes depositing mask material in the re-etched first holes, and etching the mask material in the re-etched first holes according to a second direction pattern to form lateral etch masks on the second opposing sides.

14. The method of claim 9, further comprising lining the memory pillars in the array of memory pillars by depositing a dielectric material through the second re-etched first holes to form dielectric liners, while forming voids between memory pillars in the array of memory pillars.

15. The method of claim 9, wherein each memory pillar in the array of memory pillars further includes a switch element and a barrier layer and the first stack of materials further includes a layer of materials of the switch element and a layer of materials of the barrier layer, and including laterally etching the layer of materials of the switch element and the layer of materials of the barrier layer exposed by the second re-etched first holes.

16. A device, comprising:

a 3D memory including a stack including a plurality of first access line levels interleaved with a plurality of second access line levels and a plurality of memory cell levels, the memory cell levels being disposed between corresponding first access line levels and second access line levels;

a first access line level in the plurality of first access line levels including a plurality of first access lines extending in a first direction, and a plurality of remnants of a first sacrificial material, each remnant of the first sacrificial material disposed between two first access lines of the plurality of first access lines;

a second access line level in the plurality of second access line levels including a plurality of second access lines extending in a second direction and crossing over the plurality of first access lines of adjacent first access line levels at cross-points between the first and second access lines, and a plurality of remnants of a second sacrificial material, each remnant in the plurality of remnants of the second sacrificial material extending in the first direction between two second access lines of the plurality of second access lines, and superposing first access lines in underlying first access line levels of the stack; and a memory cell level in the plurality of memory cell levels including an array of memory pillars disposed in the cross-points between the first access lines and the second access lines in adjacent first and second access line levels, and voids surrounding the memory pillars in the array of memory pillars, the first sacrificial material being different than the second sacrificial material.

17. The device of claim 16, wherein each memory pillar in the array of memory pillars includes a switch element, a barrier layer, and a programmable memory element in series.

18. The device of claim 17, wherein the programmable memory element comprises a phase change material.

* * * * *